(12) United States Patent
Dohata et al.

(10) Patent No.: US 7,808,241 B2
(45) Date of Patent: Oct. 5, 2010

(54) MAGNETIC RESONANCE IMAGING APPARATUS

(75) Inventors: Masayoshi Dohata, Yokohama (JP); Hisaaki Ochi, Kodaira (JP); Yoshiyuki Miyamoto, Abiko (JP)

(73) Assignees: Hitachi, Ltd., Tokyo (JP); Hitachi Medical Corporation, Tokyo (JP)

( * ) Notice: Subject to any disclaimer, the term of this patent is extended or adjusted under 35 U.S.C. 154(b) by 141 days.

(21) Appl. No.: 12/227,063

(22) PCT Filed: Dec. 26, 2006

(86) PCT No.: PCT/JP2006/325961
§ 371 (c)(1), (2), (4) Date: Nov. 6, 2008

(87) PCT Pub. No.: WO2007/129429
PCT Pub. Date: Nov. 15, 2007

(65) Prior Publication Data
US 2009/0160441 A1    Jun. 25, 2009

(30) Foreign Application Priority Data
May 9, 2006    (JP)    ............... 2006-130333

(51) Int. Cl.
*G01V 3/00*    (2006.01)
(52) U.S. Cl. ...................... 324/318; 324/322
(58) Field of Classification Search ......... 324/300–322; 600/407–445
See application file for complete search history.

(56) References Cited
U.S. PATENT DOCUMENTS
5,153,517 A * 10/1992 Oppelt et al. ............... 324/322
(Continued)

FOREIGN PATENT DOCUMENTS
JP    10-057340    3/1998
(Continued)

OTHER PUBLICATIONS
KlaasP. Pruessmann, Markus Weiger, Markus B.Scheidegger, and Peter Boesiger: "SENSE: Sensitivity Encoding for Fast MRI", Magnetic Resonance in Medicine, vol. 42, pp. 952-962 (Jul. 1999).
(Continued)

*Primary Examiner*—Brij B Shrivastav
(74) *Attorney, Agent, or Firm*—Antonelli, Terry, Stout & Kraus, LLP.

(57) ABSTRACT

A vertical magnetic field type MRI apparatus is capable of high-speed-imaging a large cross section such as a whole human body while suppressing an increase in the number of channels and maintaining sensitivity to a deep portion of a subject to be high. A receiving coil is composed of a plurality of sub coils. A first sub coil (3-1) of the receiving coil is arranged in a first plane (1001) including an axis substantially parallel to the direction of a static magnetic field and forms a first current loop around the surface of the subject. A second sub coil (5-1) of the receiving coil is constituted by a pair of conductor loops (5-2, 5-3) that sandwich the subject in the vicinities of the surface of the subject and are arranged substantially symmetrically each other. The conductor loops have respective cross points (5-4, 5-5). The conductor loops are arranged with the first sub coil to ensure that the cross points are located in the first plane in which the current loop of the first sub coil is provided. An electromagnetic coupling between the first and second sub coils is not generated. The second sub coil exhibits a sensitivity distribution symmetrical to the direction of the static magnetic field. The first and second sub coils are arranged as a basic configuration and combined with each other to ensure that an electromagnetic coupling with another sub coil that exhibits a sensitivity distribution symmetrical to x and y directions is suppressed.

19 Claims, 27 Drawing Sheets

U.S. PATENT DOCUMENTS

| | | | |
|---|---|---|---|
| 5,457,386 A | 10/1995 | Matsunaga et al. | |
| 7,061,242 B2 * | 6/2006 | Ochi et al. | 324/318 |
| 7,276,906 B2 * | 10/2007 | Shvartsman et al. | 324/318 |
| 2004/0061498 A1 | 4/2004 | Ochi et al. | |
| 2009/0237077 A1 * | 9/2009 | Vaughan | 324/307 |
| 2010/0033177 A1 * | 2/2010 | Ochi et al. | 324/307 |
| 2010/0033183 A1 * | 2/2010 | Ochi et al. | 324/313 |

FOREIGN PATENT DOCUMENTS

| | | |
|---|---|---|
| JP | 2002-153440 | 5/2002 |
| JP | 2003-079595 | 3/2003 |
| JP | 2004-202047 | 7/2004 |
| JP | 2008-161404 | 7/2008 |
| WO | WO 03/024327 A1 | 3/2003 |
| WO | WO 2008/081808 A1 | 7/2008 |

OTHER PUBLICATIONS

J.B.Ra, C.Y.Rim: "Fast Imaging Using Subencoding Data Sets from Multiple Detectors", Magnetic Resonance in Medicine, vol. 30, pp. 142-145 (Mar. 1993).

* cited by examiner

PLANE IN WHICH LOOP OF COIL 4-1 IS PRESENT

PLANE (Y = 0) IN WHICH LOOP OF COIL 3-1 IS PRESENT

PLANE IN WHICH LOOP OF COIL 4-1 IS PRESENT

MAGNETIC RESONANCE IMAGING APPARATUS

TECHNICAL FIELD

The present invention relates to a magnetic resonance imaging (MRI) apparatus, and more particularly to a vertical magnetic field type MRI apparatus and an RF receiving coil that is suitable for the vertical magnetic field type MRI apparatus and used to detect a nuclear magnetic resonance signal.

BACKGROUND ART

A conventional MRI apparatus uses a nuclear magnetic resonance to image the subject that is to be imaged and is placed in a uniform static magnetic field space present in the conventional MRI apparatus. A region to be imaged is limited to the static magnetic field space. In recent years, a technique has been developed to move a table (bed) mounting thereon a subject to be imaged and image a whole body of the subject. Especially, screening of a whole human body using a MRI apparatus has gained attention.

In order to measure a large region such as a whole human body, it is desirable to realize a receiving coil capable of maintaining high sensitivity to the large region and reduce the time for imaging to set a measurement time within a time for which the subject to be measured can endure the measurement. As a technique for reducing the time for imaging in an image diagnosis process using a MRI apparatus, a technique (called parallel imaging and hereinafter referred to as parallel imaging) for using a distribution of sensitivity of a plurality of RF coils to develop an aliasing artifact is starting to be put to practical use (refer to Non-Patent Document 1). This technique uses a receiving coil composed of a plurality of sub coils to simultaneously measure signals and is capable of reducing a time for imaging to a time obtained by dividing the time for the imaging by the number of the sub coils.

In order to realize the parallel imaging, it is necessary that an electromagnetic coupling between the sub coils be sufficiently small. When the electromagnetic coupling is present between the sub coils, noise interferes with an image signal at a location between the coils to reduce a signal-to-noise (S/N) ratio of an image. In addition, it is necessary that the plurality of sub coils be appropriately arranged. When the sub coils are not appropriately arranged, the S/N ratio of the image is partially reduced. There is a standard (a formula for calculation of the standard is described in Non-Patent Document 2) called a Geometry factor (hereinafter referred to as a G factor) as a standard used to evaluate whether or not the sub coils are appropriately arranged. The G factor is a numerical value of 1.0 or more and obtained from a distribution of sensitivity (to a cross section of a subject to be imaged) of each of the sub coils. The S/N ratio of each region of the image is proportional to 1/G (factor). It is, therefore, desired that a G factor for a region in which a subject to be imaged is present be as small as possible. In general, it is desired that the G factor be smaller than 2.0. In order to design a receiving coil for the parallel imaging, it is necessary to reduce the electromagnetic coupling between the plurality of sub coils used for a simultaneous signal measurement and find a coil arrangement ensuring that G factors are small for all cross sections (of a subject) to be imaged. The parallel imaging has been developed by using a horizontal magnetic field apparatus that generates a high magnetic field. Various types of receiving coils for horizontal magnetic field apparatus have been proposed.

On the other hand, a vertical magnetic field open MRI apparatus is excellent for openness of a magnet and is therefore capable of providing direct access to a subject to be imaged. The vertical magnetic field open MRI apparatus is suitable for interventional MRI. It is necessary that the direction of an RF magnetic field generated by an RF coil be perpendicular to the direction of a static magnetic field. Therefore, when the direction of the static magnetic field is changed from a horizontal direction to a vertical direction, it is also necessary that the configuration of a receiving coil be changed. In the vertical magnetic field type MRI apparatus, the direction of a static magnetic field is parallel to the vertical direction. Thus, a solenoid coil can be used. In this case, the solenoid coil is arranged around a subject that is to be imaged and normally lies down in the horizontal direction. The solenoid coil arranged around the subject to be imaged is different from a loop coil placed above the surface of the subject to be imaged, and has high sensitivity to a deep portion of the subject. When the intensity of a magnetic field generated by the vertical magnetic field type MRI apparatus is the same as that of a magnetic field generated by a horizontal magnetic field type MRI apparatus, the vertical magnetic field type MRI apparatus capable of using a solenoid coil generally has higher sensitivity to a deep portion of a subject to be imaged than that of the horizontal magnetic field type MRI apparatus.

An arrangement of a receiving coil for a vertical magnetic field is disclosed, for example, in each of Patent Documents 1 and 2. Patent Document 1 discloses that a combination of a plurality of solenoid coils arranged around a subject to be imaged with a plurality of surface coils is used as a receiving coil for vertical magnetic field type MRI; and parallel imaging is performed on a region near the heart located at a deep portion of the subject to be imaged to image the region with high sensitivity and at high speed. In Patent Document 2, a solenoid coil and a saddle coil, which are perpendicular to each other, are used to improve sensitivity to a deep portion of a subject to be imaged; and at least two sub coils are arranged in each of three directions with respect to a subject to be imaged. Since the at least two sub coils arranged in each of the three directions face each other, sensitivity profiles of the sub coils are created for three phase encoding directions. When the receiving coil arranged in the abovementioned way is used, the receiving coil has high sensitivity to a deep portion of a subject to be imaged, and high speed imaging is possible regardless of a selected phase encoding direction.

Non-Patent Document 1: J. B. Ra, C. Y. Rim: "Fast Imaging Using Subencoding Data Sets from Multiple Detectors", Magnetic Resonance in Medicine, vol. 30, pp. 142-145 (1993)

Non-Patent Document 2: Klaas P. Pruessmann, Markus Weiger, Markus B. Scheidegger, and Peter Boesiger: "SENSE: Sensitivity Encoding for Fast MRI", Magnetic Resonance in Medicine, vol. 42, pp. 952-962 (1999).

Patent Document 1: JP-A-2002-153440
Patent Document 2: JP-A-2003-79595

DISCLOSURE OF THE INVENTION

Problem to be Solved by the Invention

In each of the arrangements of the coils described in Patent Documents 1 and 2, the arrangement of the sub coils is limited in order to image a whole body of the subject to be imaged. For example, in the arrangement of the coils described in Patent Document 1, it is considered that the apparatus needs to be improved in order to arrange a plurality of sub coils in the direction of a body axis of the subject to be imaged due to a limitation of the structure of the apparatus. In the arrangement described in Patent Document 2, when sub coils are provided across the whole body of the subject to be imaged, a large number of auxiliary coils may be required in order to reduce an electromagnetic coupling between the sub coils facing each other. In other words, when the sub coils are arranged across the whole body, the number of channels may be increased. In the parallel imaging, when a large field-of-view (FOV) receiving coil, such as a solenoid coil, has high sensitivity than that of one or more pairs of small FOV receiving coils (surface coils) arranged in a phase encoding direction in an aliasing artifact region, a sensitivity distribution of the large FOV receiving coil is uniform. Thus, the sensitivity distribution cannot be used to sufficiently remove an aliasing artifact. It has been pointed out that the quality of a reconfigured image is degraded (Patent Document 3).

Patent Document 3: JP-A-2005-40315

It is, therefore, an object of the present invention to realize a receiving coil that is capable of being used for a vertical magnetic field type MRI apparatus and imaging an arbitrary cross section of a large region such as a whole human body at high speed and with high sensitivity to a deep portion of a subject and composed of sub coils having a relatively small number of channels, and to provide a receiving coil capable of being set in an excellent state.

Means for Solving the Problem

An MRI apparatus according to the present invention, which solves the abovementioned problems, includes: static magnetic field generation means for generating a static magnetic field in a vertical direction; imaging means for applying a high frequency magnetic field and a gradient magnetic field to a subject that is to be imaged and located in the static magnetic field; and receiving means for receiving a nuclear magnetic resonance signal generated by the subject to be imaged, the receiving means having a receiving coil composed of a plurality of types of sub coils; wherein the receiving coil has first and second sub coils, the first sub coil forms a current loop around the subject to be imaged, the second sub coil is constituted by a pair of surface coils that face each other, are arranged between the subject to be imaged and the vicinities of the surface of the subject to be imaged, respectively have one cross point, and are conducted to each other or are substantially conducted to each other, and when a plane in which the current loop of the first sub coil is located is regarded as a standard plane, the second sub coil is arranged to ensure that the cross points of the surface coils are present in a plane located at substantially the same position as the standard plane.

The receiving coil arranged in the abovementioned way and having the first and second sub coils suppresses an electromagnetic coupling between the sub coils, exhibits an excellent G factor, and is capable of performing imaging to obtain an image with a high S/N ratio. The surface coils constituting the second sub coil are typically figure eight coils or transformed figure eight coils.

In the present description, since conductors of the coils are actually stereoscopic, the term "plane" means a region including the conductor of any of the coils and having a certain thickness.

In the MRI apparatus according to the present invention, the standard plane in which the current loop of the first sub coil is provided is parallel to the direction of the static magnetic field, for example. The pair of surface coils constituting the second sub coil is arranged substantially symmetrically with respect to a plane perpendicular to the direction of the static magnetic field, for example.

The receiving coil included in the MRI apparatus according to the present invention may have a different type of a sub coil, in addition to the first and second sub coils. For example, the receiving coil may have, as a third coil, a sub coil forming current loops in a plurality of planes that sandwiches the standard plane and are parallel to the standard plane; as a fourth sub coil, at least one sub coil forming two current loops around and near the surface of the subject to be imaged crossing the standard plane; and as a fifth sub coil, at least one sub coil forming three current loops around and near the surface of the subject to be imaged crossing the standard plane. In this case, the third sub coil may form two current loops in two planes that are parallel to and symmetrical to the standard plane, are apart by distances nearly equal to each other from the standard plane, and are connected to each other to ensure that currents flow in the two current loops and in directions opposite to each other. Only one type of the third to fifth sub coils may be added to the receiving coil. Alternatively, two or three types of the third to fifth sub coils may be added to the receiving coil. When the third to fifth sub coils are added to the receiving coil, the receiving coil can exhibit the most excellent G factor.

It is preferable that each of the fourth and fifth sub coils have at least a pair of sub coils located substantially symmetrically with respect to the standard plane. This configuration allows the receiving coil to exhibit an excellent G factor. The relationship between the fourth and fifth sub coils is preferably established to ensure that a cross point of the two current loops of the fourth sub coil is located at substantially the center of two cross points present between the current loops of the fifth sub coil. This configuration can suppress an electromagnetic coupling between the fourth and fifth sub coils.

A plurality of the receiving coils included in the MRI apparatus according to the present invention may be arranged side by side in a direction in which the plurality of sub coils crosses the standard plane. For example, the plurality of receiving coils is arranged in the direction of a body axis of a subject to be imaged (which is typically a human body) to constitute a whole-body receiving coil.

When the MRI apparatus according to the present invention has movement means for moving a subject to be imaged in one of directions perpendicular to the static magnetic field, the direction in which the plurality of types of sub coils is arranged is, for example, the direction in which the movement means moves.

When the plurality of types of sub coils is arranged in a predetermined direction, at least one type of the sub coils that are provided around and near the surface of the subject to be imaged are preferably arranged to ensure that sub coils adjacent to each other partially overlap with each other in the direction in which the sub coils are arranged. This arrangement can suppress an electromagnetic coupling between the sub coils adjacent to each other.

When the side close to the subject to be imaged is regarded as an inner side and the side distant from the subject to be imaged is regarded as an outer side, the receiving coil included in the MRI apparatus according to the present invention is configured to ensure that at least one of the fourth and fifth sub coils is located on the inner side with respect to the first to third sub coils. This configuration allows the receiving coil configured by combining the plurality of types of sub coils to be easily set for the subject to be imaged.

In this case, it is preferable that at least one of the fourth and fifth sub coils be held by a base that has flexibility and is openable and closable at a region at which a coil conductor is not present. Since the base is made of a material having flexibility, feeling of pressure against the subject to be imaged can be reduced.

The MRI apparatus according to the present invention has switching means for sequentially switching between the plurality of sub coils, for example. The MRI apparatus having this configuration is capable of imaging the subject while the subject to be imaged moves. When the MRI apparatus according to the present invention has the movement means for moving the subject to be imaged in one of the directions perpendicular to the static magnetic field, the switching means is synchronized with the movement of the movement means to switch between the plurality of sub coils.

The receiving coil according to the present invention receives a nuclear magnetic resonance signal, and has the first and second sub coils. The first sub coil forms the current loop in a first plane. The second sub coil is arranged symmetrically with respect to a second plane that crosses the first plane. The second sub coil is constituted by the pair of surface coils. Each of the surface coils has one cross point. The second sub coil is arranged to ensure that the cross points are located in a plane including the first plane.

The receiving coil according to the present invention has high sensitivity distribution to a deep portion of the subject to be imaged and is capable of imaging an arbitrary cross section of the subject at high speed. Although the receiving coil according to the present invention is suitable for a vertical magnetic field type MRI apparatus, the receiving coil may be applied to a horizontal magnetic field type MRI apparatus.

EFFECT OF THE INVENTION

In the receiving coil according to the present invention, the sub coils constituting the receiving coil may be transformed into various shapes based on the shape of the subject to be imaged and on the combination of the sub coils. For example, part of a conductor of the second sub coil is located in a plane parallel to the second plane, while another part of the conductor of the second sub coil forms a curved portion that is bent with respect to the second plane. The receiving coil having this configuration is shaped based on the shape of the human body that is the subject to be imaged. In addition, the receiving coil having this configuration has higher sensitivity.

The receiving coil according to the present invention may have an additional sub coil, in addition to the first and second sub coils. This configuration makes it possible to selectively set the phase encoding direction to an arbitrary direction for the parallel imaging.

BRIEF DESCRIPTION OF THE DRAWINGS

FIG. 4B is a diagram showing the first type of sub coil constituting a part of the receiving coil shown in FIGS. 3A to 3D.

Figure 1:
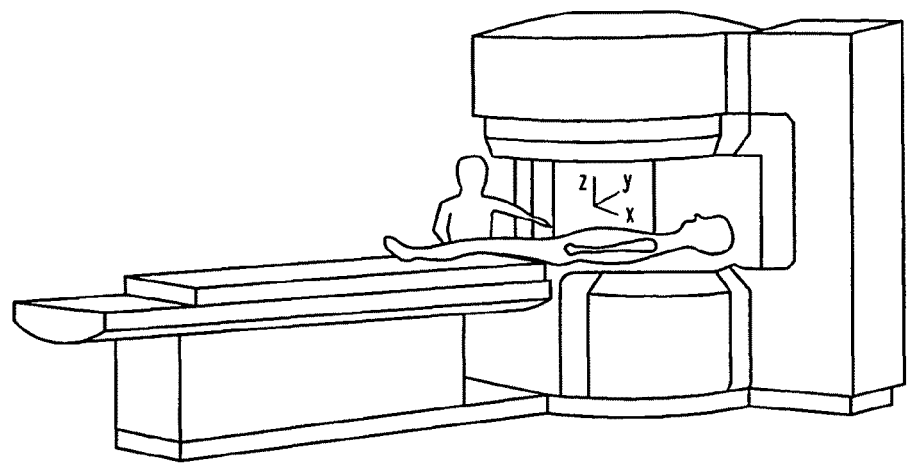
FIG. 1 is a diagram showing a vertical magnetic field type MRI apparatus according to the present invention.

DESCRIPTION OF REFERENCE NUMERALS 3-1 (3-1-1 to 3-1-7) . . . First sub coil (first type of sub coil), 4-1 (4-1-1 to 4-1-7) . . . Second type of sub coil, 5-1 (5-1-1 to 5-1-7) . . . Second sub coil (third type of sub coil), 5-4, 5-5 . . . Cross point, 5-6 . . . Feeding point, 6-1 (6-1-1 to 6-1-6) . . . Fourth type of sub coil, 7-1 (7-1-1 to 7-1-6) . . . Fifth type of sub coil, 19-3 (19-3-1 to 19-3-8) . . . Switching circuit, 20-1, 20-2 . . . Base, 101 . . . Magnet for generating a static magnetic field, 102 . . . Gradient magnetic field coil, 103 . . . Subject (subject to be imaged), 107 . . . Transmit coil, 107, 116 . . . Receiving coil, 104 . . . Sequencer, 109 . . . Computer, 1001 . . . First plane

BEST MODE FOR CARRYING OUT THE INVENTION

An MRI apparatus according to an embodiment of the present invention and an RF coil provided in the MRI apparatus will be described below.

Figure 2:
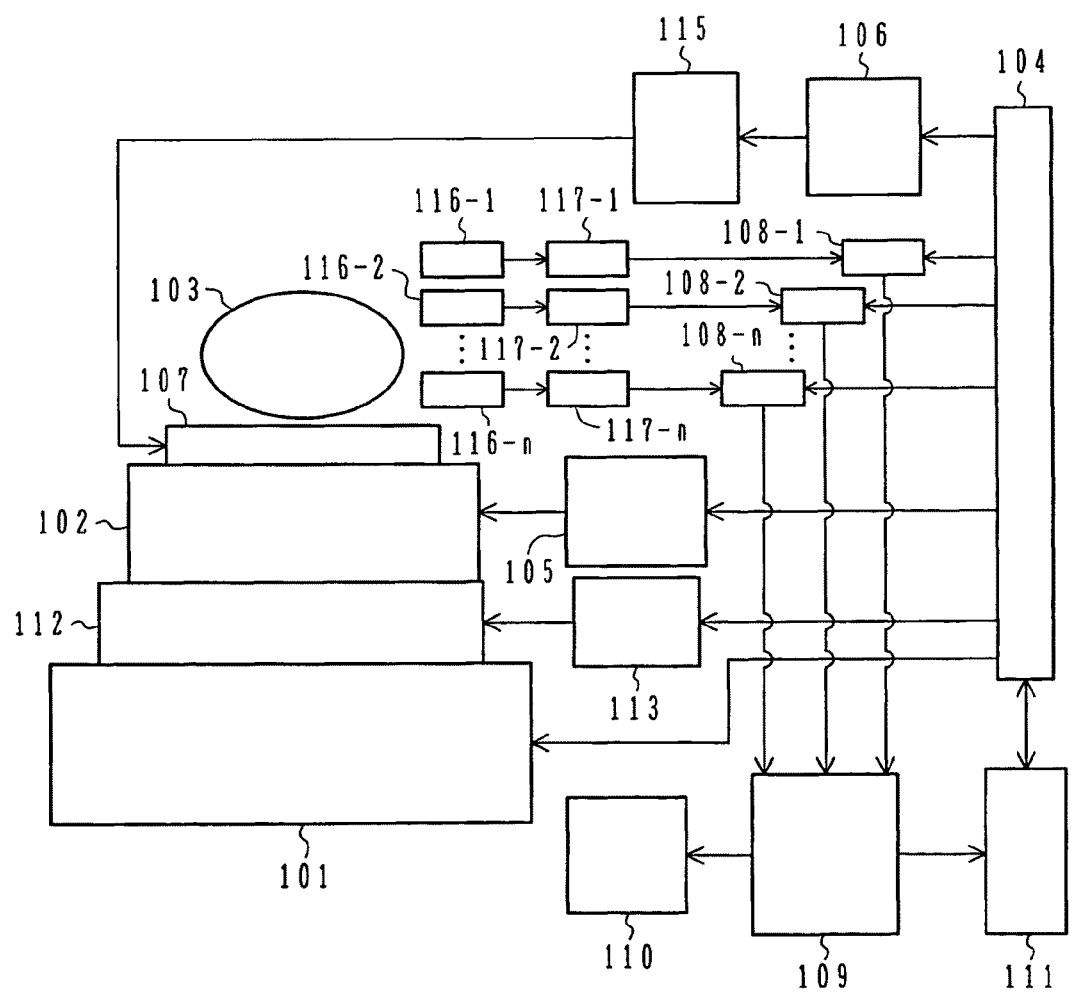
FIG. 2 is a diagram showing the entire configuration of the MRI apparatus according to the present invention.

FIG. 1 shows an appearance of the MRI apparatus. FIG. 2 shows an example of the configuration of the MRI apparatus. The MRI apparatus includes a magnet 101, a gradient magnetic field coil 102, a transmit coil 107, a receiving coil 116, a sequencer 104, and a computer 109. The magnet 101 generates a static magnetic field in a vertical direction. The gradient magnetic field coil 102 generates a gradient magnetic field. The transmit coil 107 transmits an RF pulse. The receiving coil 116 receives a nuclear magnetic resonance signal generated from a subject 103 to be imaged. The transmit coil 107 and the receiving coil 116 are provided in the magnet 101 and the gradient magnetic field generation coil 102.

In FIG. 2, only one magnet 101 is shown. However, a pair of the magnets 101 is provided. The magnets 101 sandwiches the subject 103 in the vertical direction. The subject 103 is placed in a space between the magnets under the condition that the subject 103 lies down. In FIG. 1, the direction of the static magnetic field is a z direction.

The gradient magnetic field generation coil 102 is composed of three-axis gradient magnetic field coils that are perpendicular to each other. The three-axis gradient magnetic field coils are connected with a gradient magnetic field power supply 105. The transmit coil 107 is connected to an RF pulse generator 106 through an RF power amplifier 115. The sequencer 104 provides a command to the gradient magnetic field power supply 105 and provides a command to the RF pulse generator 106. Then, the gradient magnetic field coil 102 generates a gradient magnetic field, and the transmit coil 107 generates an RF pulse. The output of the RF pulse generator 106 is amplified by the RF power amplifier 115. The amplified output of the RF pulse generator 106 is applied to the transmit coil 107. The RF pulse is applied to the subject 103 via the transmit coil 107.

The nuclear magnetic resonance signal generated from the subject 103 is received by the receiving coil 116. The receiving coil 116 is composed of a plurality of sub coils 116-1 to 116-*n*. The receiving coil 116 is described later in detail. The signal received by the receiving coil 116 is amplified to a level necessary for detection by preamplifiers 117-1 to 117-*n*. After that, a receiver 108 performs analog-to-digital conversion (sampling) on the signal and then detects the signal. A central frequency (magnetic resonance frequency), which is the standard of the detection, is set by the sequencer 104. The detected signal is transmitted to the computer 109. The computer 109 performs resampling on the signal, and then performs signal processing, such as image reconfiguration, on the signal. The result of the processing is displayed by a display 110.

The signal and conditions for the measurement may be stored in a storage medium 111 when necessary. When homogeneity of the static magnetic field needs to be adjusted, a shim coil 112 is used. The shim coil 112 has a plurality of channels. A current is supplied to the shim coil 112 by a shim power supply 113. A current flowing in each of coils of the plurality of channels is controlled by the sequencer 104 to ensure that an additional magnetic field is generated by the shim coil 112 in order to correct inhomogeneity of the static magnetic field. The sequencer 104 performs control to ensure that each device operates at a programmed timing and with a programmed intensity. Among the programs, a program describing the application of the RF pulse, a program describing the application of the gradient magnetic field, a program describing the timing of receiving the nuclear magnetic resonance signal, a program describing the intensities of the RF pulse and gradient magnetic field, are called an imaging sequence.

Next, the receiving coil used in the MRI apparatus according to the present invention will be described. In the description below, the direction (vertical direction) of the static magnetic field is the z direction; two directions that are perpendicular to each other and perpendicular to the z direction are x and y directions; the direction extending between the left and right sides of the subject 103 is the x direction; and the direction of the body axis of the subject 103 is the y direction.

Figure 3A:
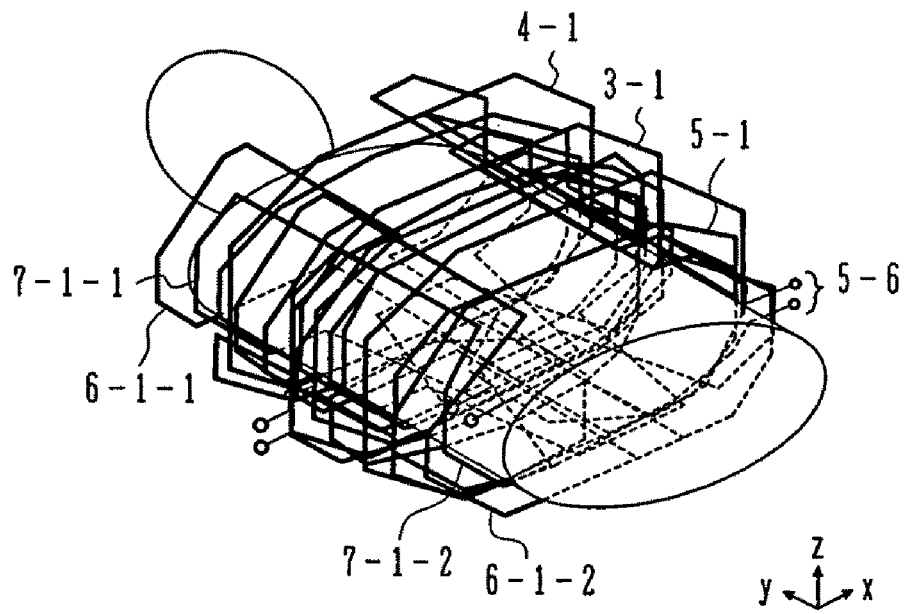
FIG. 3A is a diagram showing a receiving coil according to an embodiment of the present invention.
Figure 3B:
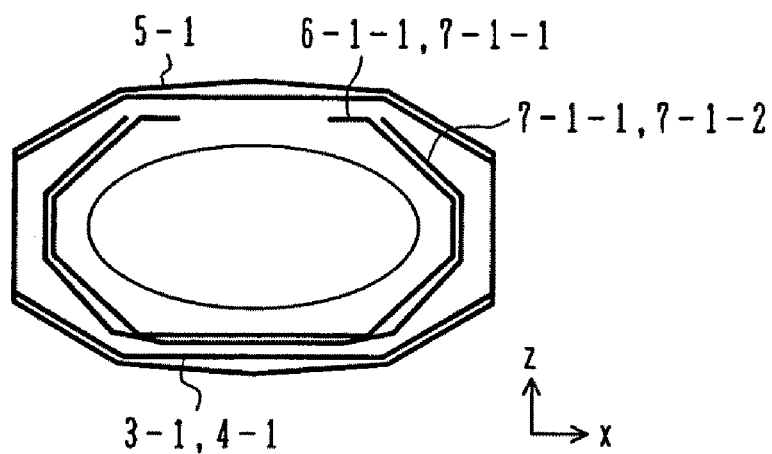
FIG. 3B is a diagram showing the receiving coil according to the embodiment of the present invention.
Figure 3C:
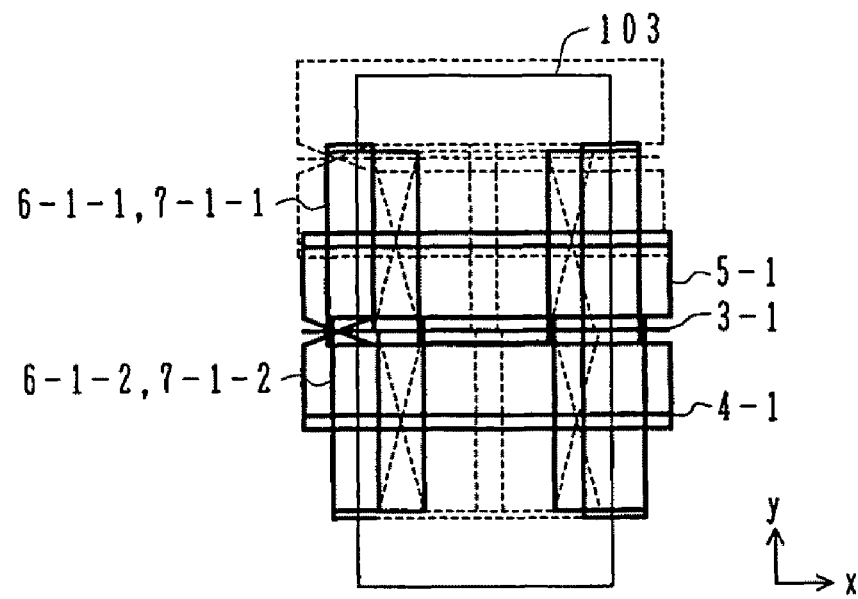
FIG. 3C is a diagram showing the receiving coil according to the embodiment of the present invention.
Figure 3D:
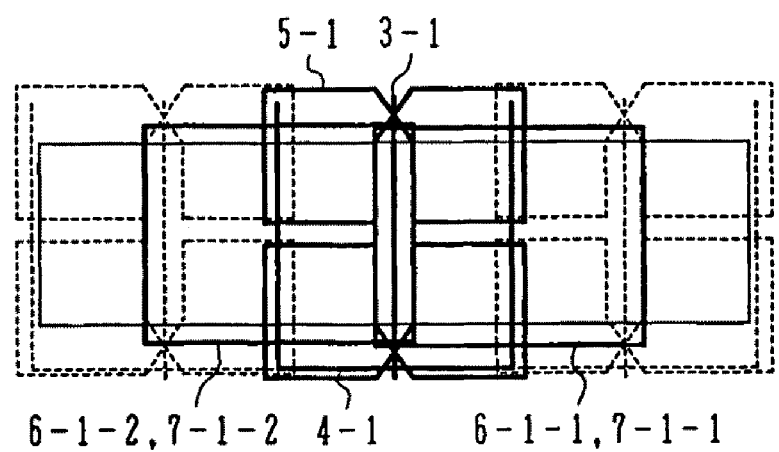
FIG. 3D is a diagram showing the receiving coil according to the embodiment of the present invention.

First, the receiving coil according to the embodiment of the present invention will be described. The receiving coil according to the embodiment has five types of sub coils. The sub coils of each type are arranged in the y direction (the direction of the body axis of the subject). The receiving coil almost entirely covers the whole body of the subject 103. FIGS. 3A to 3D show a single block of the entire receiving coil covering the whole body. FIG. 3A is a perspective view of the receiving coil. FIGS. 3B to 3D are diagrams showing the receiving coil when viewed from the y direction, the z direction, and the x direction, respectively. The actual receiving coil is configured by dividing its conductor into a plurality of pieces by means of capacitors and used to ensure that a resonance frequency of the coil matches a nuclear magnetic resonance frequency. In the drawings showing the embodiment, the capacitors are omitted sometimes.

As shown in FIGS. 3A to 3D, the receiving coil according to the embodiment is composed of sub coils 3-1, 4-1, 5-1, 6-1-1, 6-1-2, 7-1-1, and 7-1-2. The sub coil 3-1 forms a current loop around the subject 103. The sub coil 4-1 forms two current loops in two planes that sandwich a plane (x-z plane) in which the current loop of the sub coil 3-1 is provided. The two planes are apart by distances nearly equal to each other from the plane (x-z plane). Currents flow in the two current loops of the sub coil 4-1 and in directions opposite to each other. The sub coil 5-1 sandwiches the subject and is arranged on the upper and lower sides (front and back sides) of the subject. The sub coils 6-1-1 and 6-1-2 cover the sides of the subject 103. The sub coils 6-1-1 and 6-1-2 are of the same type, while the sub coils 7-1-1 and 7-1-2 are of the same type. The sub coils 6-1-1, 6-1-2, 7-1-1, and 7-1-2 constitute one block of the receiving coil. The five types of sub coils are arranged symmetrically with respect to the plane (x-z plane) in which the current loop of the sub coil 3-1 is provided. When a block shown in FIGS. 3A to 3D is regarded as a unit, a plurality of blocks is arrayed in a direction perpendicular to this plane, i.e., the y direction.

Next, the five types of sub coils constituting the receiving coil and the relationships between the sub coils will be described below.

Figure 4A:
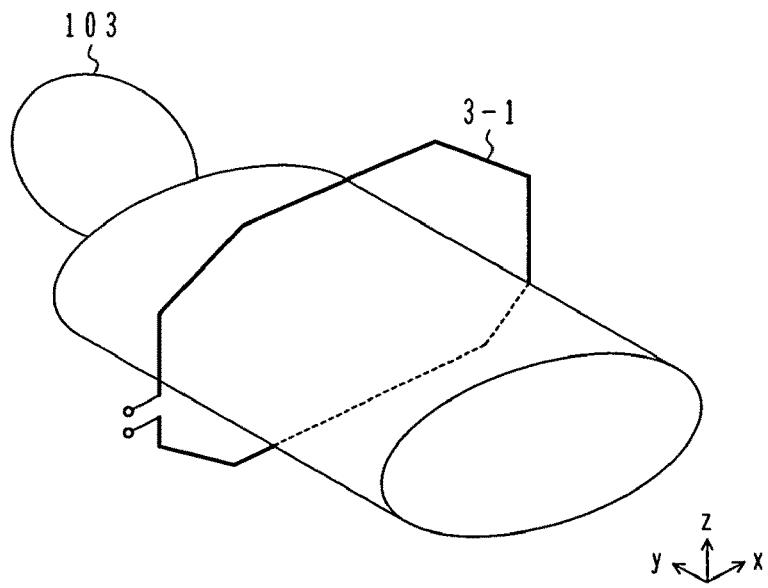
FIG. 4A is a diagram showing a first type of sub coil constituting a part of the receiving coil shown in FIGS. 3A to 3D.
Figure 4A:
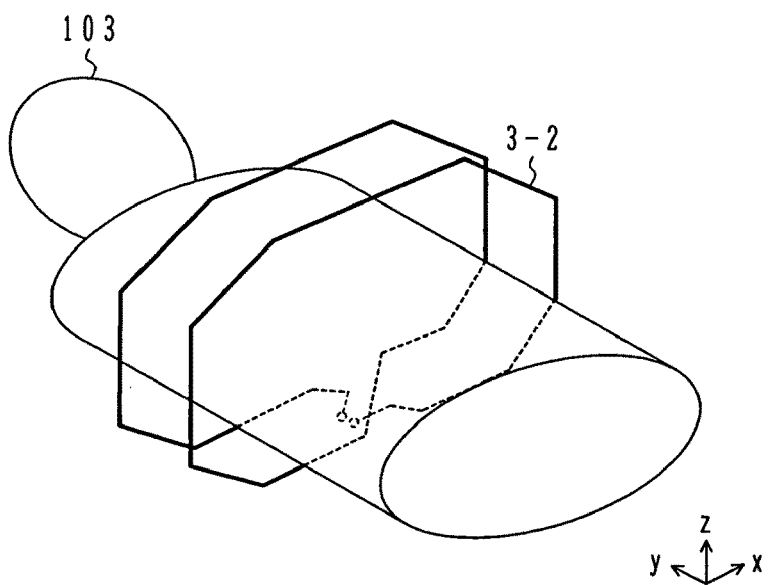
Figure 4C:
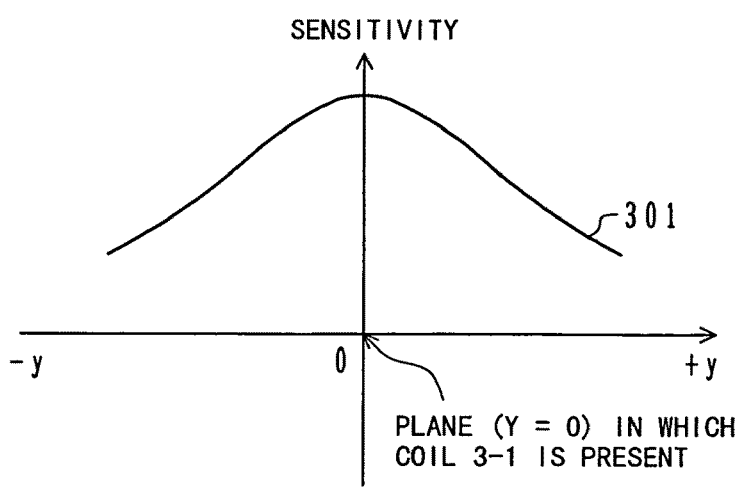
FIG. 4C is a graph showing characteristics of the first type of sub coil constituting the part of the receiving coil shown in FIGS. 3A to 3D.

The first type of sub coil 3-1 is a solenoid coil arranged around the subject 103 as shown in FIG. 4A. A distribution 301 of sensitivity of the sub coil 3-1 in the y direction has the maximum value at the plane in which the current loop of the sub coil 3-1 is present as shown in FIG. 4C. The sub coil 3-1 has high sensitivity in a large area and is thus called a large FOV coil. Since the plane in which the current loop of the sub coil 3-1 is provided is used as a standard for the case where another type of sub coil is arranged, the plane is regarded as a standard plane having a y coordinate of 0. The center of the current loop of the sub coil 3-1 in the standard plane is regarded as an original point having an x coordinate of 0 and a z coordinate of 0. In FIG. 4A, the solenoid coil having one turn is shown. The number of the turns of the solenoid coil may be two or more. For example, a solenoid coil 3-2 having two turns may be provided as shown in FIG. 4B. In this case, a plane located centrally between the two turns is regarded as the standard plane.

Figure 5A:
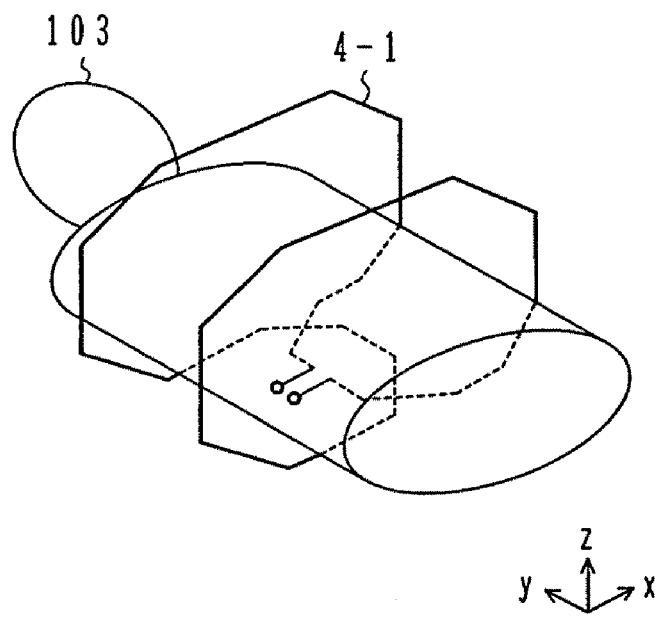
FIG. 5A is a diagram showing a second type of sub coil constituting a part of the receiving coil shown in FIGS. 3A to 3D.
Figure 5B:
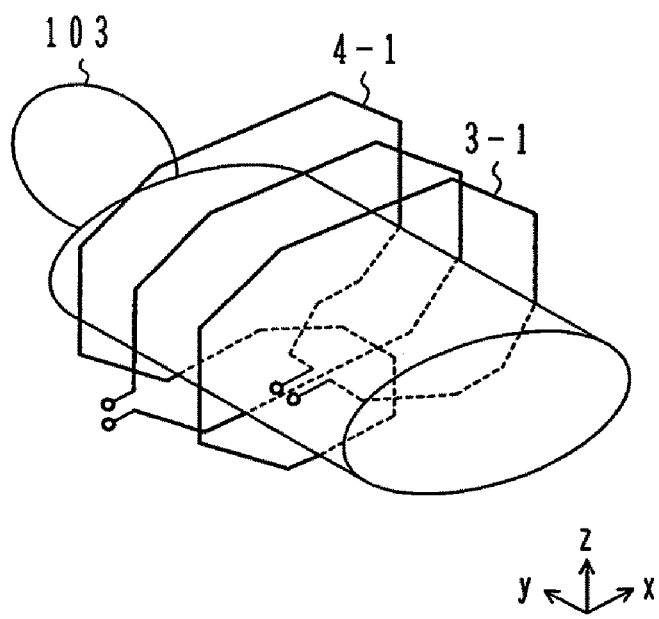
FIG. 5B is a diagram showing the second type of sub coil constituting the part of the receiving coil shown in FIGS. 3A to 3D.
Figure 5C:
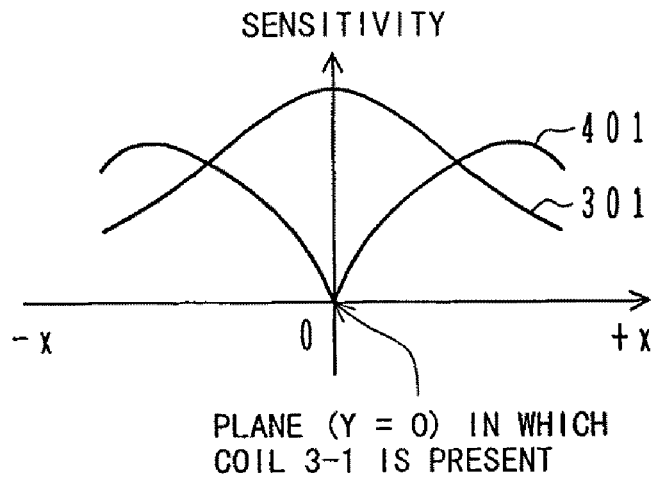
FIG. 5C is a graph showing characteristics of the second type of sub coil constituting the part of the receiving coil shown in FIGS. 3A to 3D.

The second type of sub coil 4-1 forms the two current loops around the subject as shown in FIG. 5A. The two current loops of the sub coil 4-1 are arranged symmetrically with respect to the standard plane in which the sub coil 3-1 is present as shown in FIG. 5B. The two current loops of the sub coil 4-1 are provided in x-z planes. Two current loops of the sub coil 4-1 are connected to each other to ensure that currents flow in the two current loops of the sub coil 4-1 and in directions opposite to each other. When a current is supplied to the sub coil 4-1, currents flow in the two current loops and in the directions opposite to each other. Thus, high-intensity magnetic fields are generated by the two current loops in the vicinities of the two current loops. As the magnetic field generated by one of the two current loops is more distant from the one of the current loops, a component of the magnetic field that is generated by the one of the current loops and cancelled by the magnetic field generated by the other of the current loops is larger. The intensities of the magnetic fields at the center of the two current loops are zero. That is, in a distribution of sensitivity 401 of the sub coil 4-1 on the y axis as shown in FIG. 5C, the sensitivity of the sub coil 4-1 in a cross section (the standard plane) in which the sub coil 3-1 is present is nearly equal to zero. The sub coil 4-1 exhibits the sensitivity distribution that is bilaterally symmetrical to the cross section. A distribution of a magnetic field actually generated when power of 1 watt is supplied to a feeding point has positive and negative signs on the left and right sides, when the y axis is regarded as a standard. Here, the distribution has the absolute values and is treated as a sensitivity distribution curved line (hereinafter, a sensitivity distribution curved line is defined in the same manner).

Figure 5D:
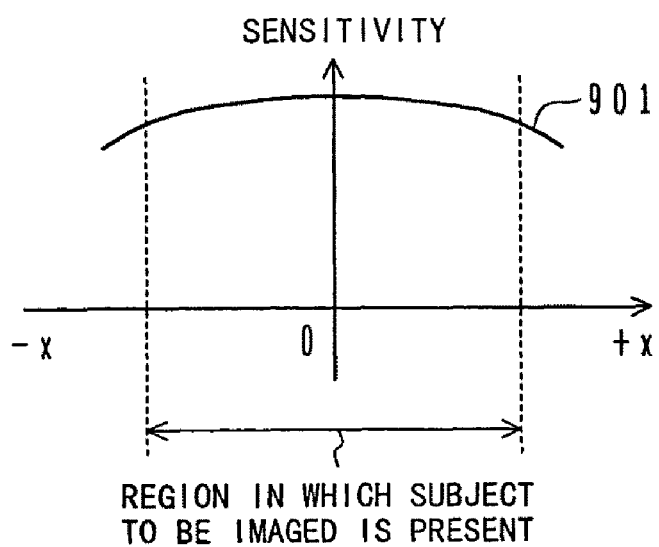
FIG. 5D is a graph showing characteristics of the second type of sub coil constituting the part of the receiving coil shown in FIGS. 3A to 3D.

In this arrangement, both the sub coils 4-1 and 3-1 do not generate an induced current. An electromagnetic coupling between the sub coils 3-1 and 4-1 is therefore suppressed to a level at which no practical problem occurs. Combined sensitivity of the sub coils 3-1 and 4-1 is equal to the square root of the sum of the squares of sensitivity values of the sub coils 3-1 and 4-1. A distribution of the combined sensitivity is indicated by a curved line 901 shown in FIG. 5D. The combined sensitivity (indicated by the curved line 901) obtained when the sub coils 3-1 and 4-1 are used is higher than sensitivity of either one of the sub coils 3-1 and 4-1 on the entire y axis.

Figure 6A:
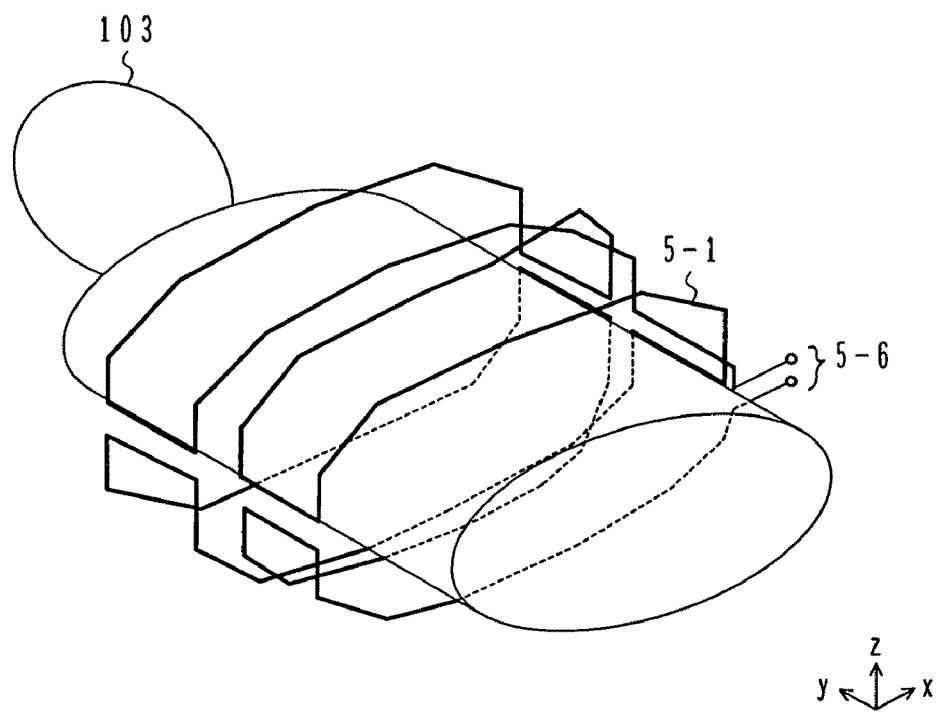
FIG. 6A is a diagram showing a third type of sub coil constituting a part of the receiving coil shown in FIGS. 3A to 3D.
Figure 6B:
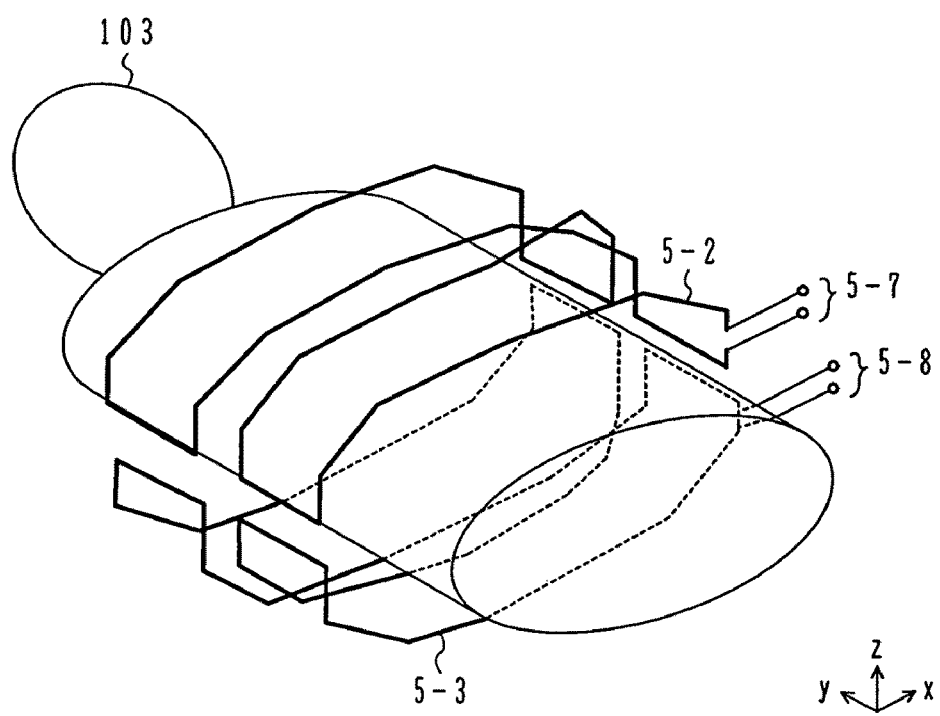
FIG. 6B is a diagram showing the third type of sub coil constituting a part of the receiving coil shown in FIGS. 3A to 3D.

The third type of sub coil 5-1 has a shape shown in FIG. 6A. The sub coil 5-1 has coils 5-2 and 5-3. The coils 5-2 and 5-3 face each other in a front-back direction (z direction) of the subject 103. The coils 5-2 and 5-3 have shapes similar to each other and are conducted to each other. The sub coil 5-1 has a single feeding point 5-6. The coils 5-2 and 5-3 are configured by arranging two current loops in the y direction. A cross point is provided between the two current loops. The cross point present between the two current loops is located in the plane in which the current loop of the sub coil 3-1 is present, i.e., is located in the standard plane. The coils 5-2 and 5-3 are arranged substantially symmetrically with respect to the subject 103.

Figure 7A:
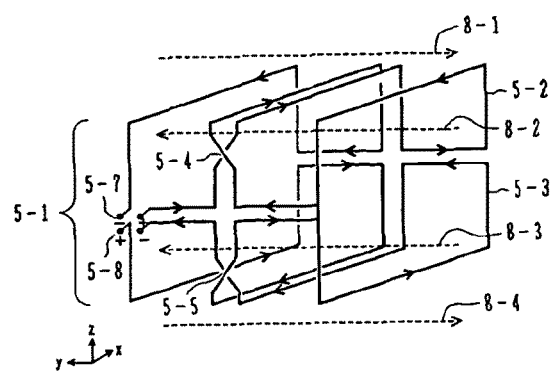
FIG. 7A is a diagram showing characteristics of the third type of sub coil.
Figure 7B:
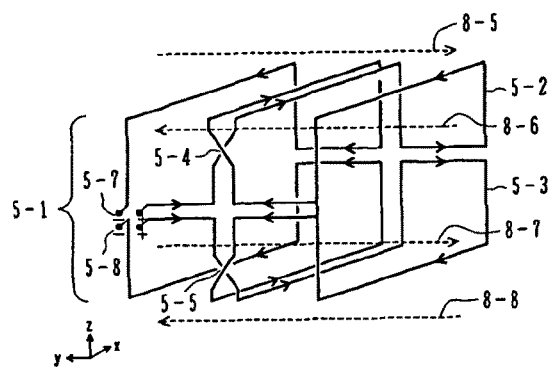
FIG. 7B is a diagram showing characteristics of the third type of sub coil.

A magnetic field generated by the sub coil 5-1 is described below with reference to FIGS. 7A to 7D. FIGS. 7A and 7B show the case where the coils 5-2 and 5-3 are not conducted to each other. As shown in FIG. 7A, currents are supplied from feeding points 5-7 and 5-8 to the coils 5-2 and 5-3 to ensure that the currents flow in the coils 5-2 and 5-3 and in directions opposite to each other. That is, the currents flow in coil conductors in directions indicated by arrows shown in FIG. 7A. In this case, magnetic fields generated by the coil 5-2 are directed along broken lines 8-1 and 8-2, while magnetic fields generated by the coil 5-3 are directed along broken lines 8-3 and 8-4. In this case, each of the coils 5-2 and 5-3 generates the magnetic field directed in a minus y direction in an area (in which the subject is present) located on inner sides of the coils 5-2 and 5-3. The magnetic fields directed in the minus y directions reinforce each other.

As shown in FIG. 7B, currents are supplied from the feeding points 5-7 and 5-8 to the coils 5-2 and 5-3 to ensure that the currents flow in the same direction in the coils 5-2 and 5-3. That is, the currents flow in coil conductors in directions indicated by arrows shown in FIG. 7B. In this case, magnetic fields generated by the coil 5-2 are directed along broken lines 8-5 and 8-6, while magnetic fields generated by the coil 5-3 are directed along broken lines 8-7 and 8-8. In this case, the coils 5-2 and 5-3 generate the magnetic fields directed in the directions opposite to each other on the y axis in an area (in which the subject is present) located on inner sides of the coils 5-2 and 5-3. The magnetic fields are cancelled to each other at a z coordinate of 0. It is apparent that the sensitivity to a deep portion of the subject is nearly equal to 0. The magnetic fields are generated under the condition that phases of the currents flowing in the coil conductors match each other. When the coils facing each other have the same shape, a coupling may be generated between the coils facing each other to reduce the sensitivity.

Figure 7C:
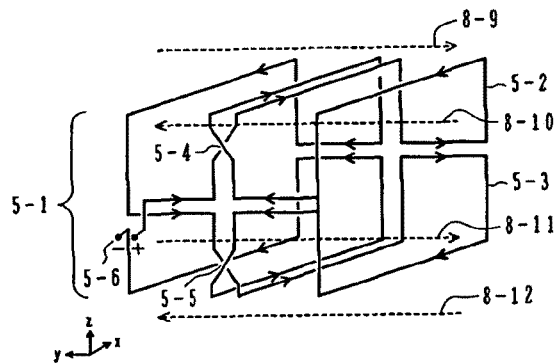
FIG. 7C is a diagram showing characteristics of the third type of sub coil.
Figure 7D:
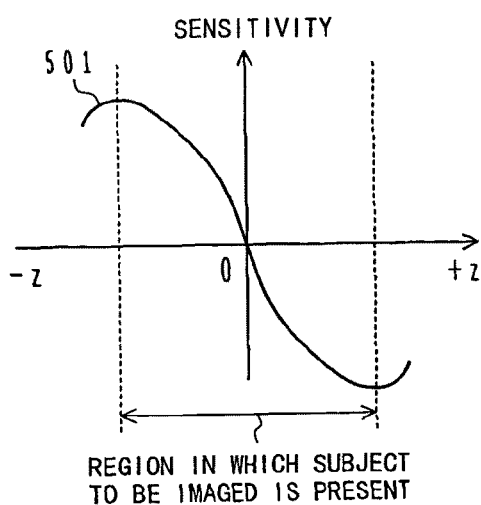
FIG. 7D is a graph showing characteristics of the third type of sub coil.

The third type of sub coil 5-1 is configured by causing the coils 5-2 and 5-3 to be conducted to each other as shown in FIG. 7C. A current is supplied from a feeding point 5-6 to the sub coil 5-1 to ensure that currents in the coil conductors flow in the same manner as the current flow shown in FIG. 7B. That is, currents flow in the coils 5-2 and 5-3 in the same direction at a position having a z coordinate of 0 and symmetrical to the x-y plane. In this case, since the coils 5-2 and 5-3 are conducted to each other, the currents having the same phase can flow at a position symmetrical to the x-y plane. As a result, the generated magnetic fields are directed along broken lines 8-9 to 8-12 shown in FIG. 7C. The magnetic fields generated in an area (in which the subject is present) located on inner sides of the coils 5-2 and 5-3 are indicated by a distribution as shown in FIG. 7D. That is, the intensity of the magnetic field is zero at a z coordinate of 0 in the x-y plane. The distribution is symmetrical to the z axis (indicated by the curved line 501 shown in FIG. 7D).

Figure 8A:
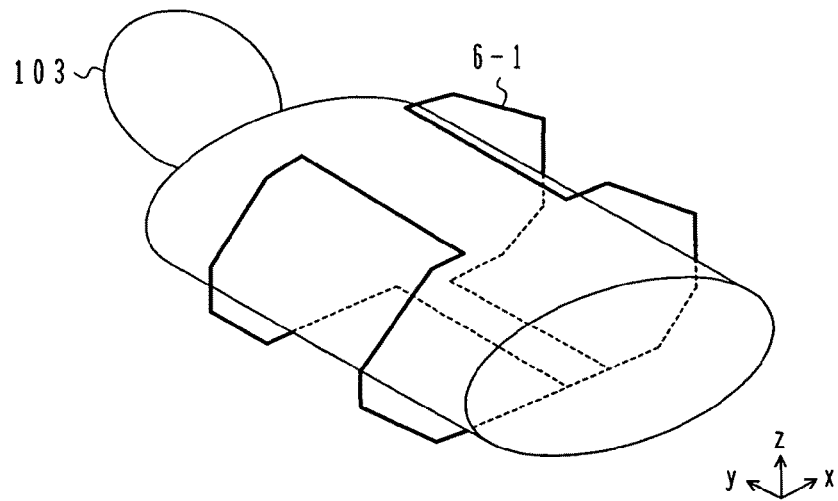
FIG. 8A is a diagram showing a fourth type of sub coil constituting a part of the receiving coil shown in FIGS. 3A to 3D.
Figure 8B:
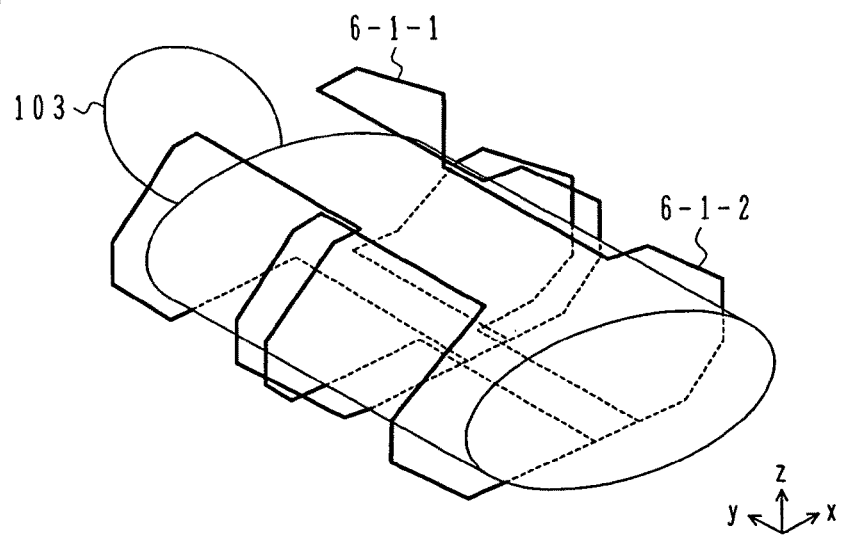
FIG. 8B is a diagram showing the fourth type of sub coil constituting the part of the receiving coil shown in FIGS. 3A to 3D.
Figure 8C:
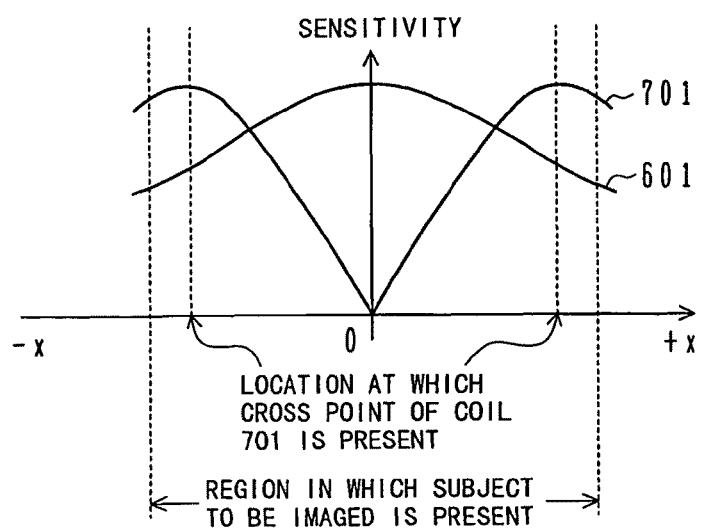
FIG. 8C is a graph showing the fourth type of sub coil constituting the part of the receiving coil shown in FIGS. 3A to 3D.

The fourth type of sub coil 6-1 is a coil (saddle coil) having two current loops arranged above the surface of the subject as shown in FIG. 8A. In FIG. 8A, the number of the fourth type of sub coils is one. However, as shown in FIG. 8B, the sub coils 6-1-1 and 6-1-2 arranged in the y direction constitute one block of the receiving coil according to the embodiment. The sub coils 6-1-1 and 6-1-2 are arranged to ensure that the plane (standard plane) in which the current loop of the first type of sub coil 3-1 is provided is located at substantially the center of the sub coils 6-1-1 and 6-1-2. In the entire receiving coil, the sub coils 6-1 are successively arranged in the y direction to cover the entire subject 103. In this case, the sub coils 6-1 adjacent to each other adequately overlap each other (about 10% of the area of each sub coil 6-1 is overlapped) to ensure that a magnetic coupling between the adjacent sub coils is removed. Each of the sub coils 6-1 has a curved portion that surrounds both sides of the subject 103. In this configuration, a distribution of sensitivity of the sub coil 6-1 in the x direction is shown in FIG. 8C. As shown in FIG. 8C, the sub coil 6-1 exhibits a sensitivity distribution 601 in which sensitivity to the deep portion of the subject 103 is high (as is the case with the sub coil 3-1). The sub coil 6-1 is therefore called as the large FOV coil.

Figure 9A:
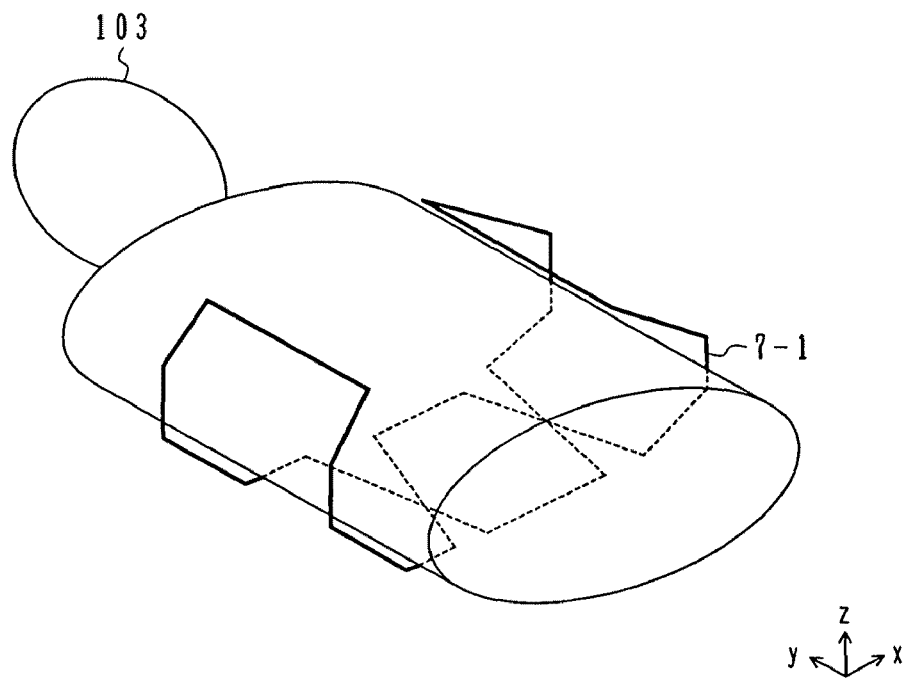
FIG. 9A is a diagram showing a fifth type of sub coil constituting a part of the receiving coil shown in FIGS. 3A to 3D and characteristics of the fifth type of sub coil.
Figure 9B:
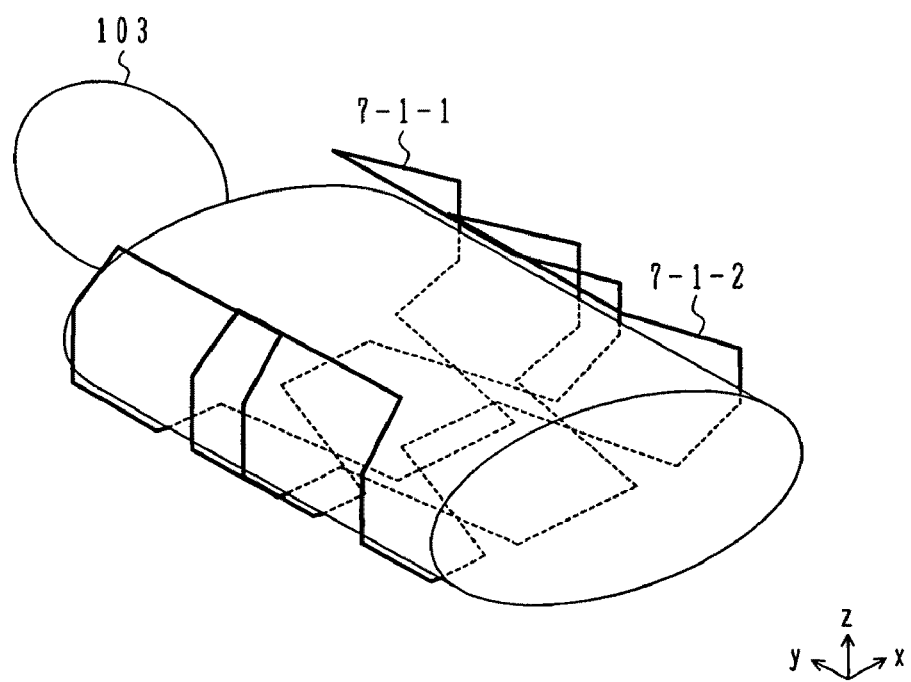
FIG. 9B is a diagram showing the fifth type of sub coil constituting a part of the receiving coil shown in FIGS. 3A to 3D and characteristics of the fifth type of sub coil.

The fifth type of sub coil 7-1 has three current loops arranged above the surface of the subject 103 as shown in FIG. 9A. The sub coil 7-1 has a curved portion that surrounds both sides of the subject 103. In FIG. 9A, the number of the fifth type of sub coil 7-1 is one. However, as shown in FIG. 9B, the two sub coils 7-1-1 and 7-1-2 arranged in the y direction constitute one block of the receiving coil according to the embodiment. In the one block, the two sub coils 7-1-1 and 7-1-2 are arranged to ensure that the standard plane (in which the current loop of the first type of sub coil 3-1 is provided) is located at substantially the center of the two sub coils 7-1-1 and 7-1-2 in the y direction. In the entire receiving coil, the sub coils 7-1 are successively arranged in the y direction to cover the entire subject 103. The fifth type of sub coils 7-1 adjacent to each other adequately overlap each other (about 10% of the area of each sub coil is overlapped) to ensure that a magnetic coupling between the adjacent coils is removed.

In the sub coil 7-1 having this configuration, currents flow in two conductors crossing each other and in the same direction at two cross points. Thus, the sensitivity of the sub coil 7-1 is the highest at the cross points. The currents flow at each of the two cross points and in directions opposite to each other. The sensitivity of the sub coil 7-1 at the cross points is the maximum, while the sensitivity of the sub coil 7-1 on a perpendicular bisector of a line segment connecting the two cross points is the minimum. The sensitivity distribution of the sub coil 7-1 is indicated by a curved line 701 shown in FIG. 8C. As shown in FIG. 8C, when the sub coils 6-1 and 7-1 are arranged to ensure that the vicinity of two areas in which the sensitivity of the sub coil 6-1 having the two current loops is the minimum substantially match two areas (in which two cross points are present) in which the sensitivity of the sub coil 7-1 having the three current loops is the maximum, and when a current flows in one of the sub coils 6-1 and 7-1, the intensity of an induced magnetic field generated by the other of the sub coils 6-1 and 7-1 can be practically ignored. An electromagnetic coupling between the sub coils 6-1 and 7-1 can be suppressed to a level at which no practical problem occurs.

Next, a description will be made of the relationships between the first to fifth types of sub coils described above, especially, a sensitivity distribution direction of each sub coil and an electromagnetic coupling.

As described above, the electromagnetic coupling between the sub coils 3-1 and 4-1 arranged around the subject 103 can be suppressed to a level at which no practical problem occurs. As also described above, the electromagnetic coupling between the sub coils 6-1 and 7-1 appropriately arranged above the subject 103 can be suppressed to a level at which no practical problem occurs.

Figure 10A:
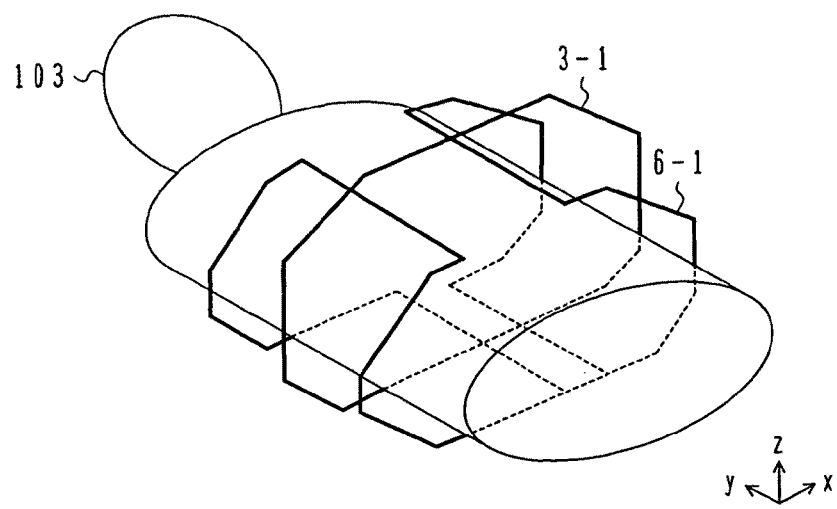
FIG. 10A is a diagram showing an arrangement of the first and fourth types of sub coils.
Figure 10B:
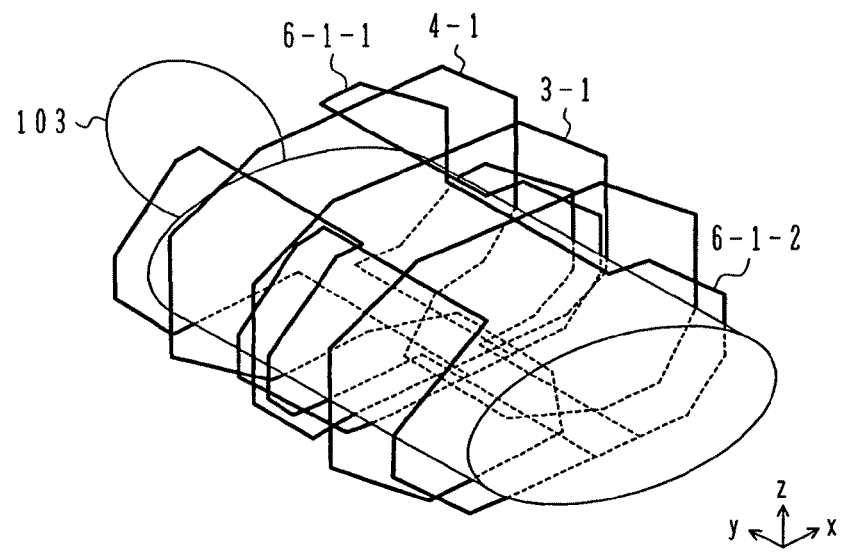
FIG. 10B is a diagram showing an arrangement of the first, second, and fourth types of sub coils.

The relationship between the sub coils 3-1 and 4-1 and the relationship between the sub coils 6-1 and 7-1 are described below. The direction of the maximum sensitivity of the sub coils 3-1 and 4-1 arranged around the subject 103 is the y direction. On the other hand, the direction of the maximum sensitivity of the sub coils 6-1 and 7-1 arranged above the subject 103 is the x direction. Even when the sub coils 3-1 and 6-1 are arranged as shown in FIG. 10A, the sub coils 3-1 and 6-1 are electrically orthogonal to each other. Thus, an electromagnetic coupling between the sub coils 3-1 and 6-1 is suppressed to a level at which no practical problem occurs. In addition, since each of the sub coils 3-1 and 6-1 has high sensitivity to the deep portion of the subject 103, it can be expected that the sensitivity to the deep portion of the subject 103 is further improved in the arrangement of the sub coils 3-1 and 6-1. The direction of the maximum sensitivity of the sub coil 4-1 is also the y direction. Even when the sub coil 6-1 is shifted from the position at which the sub coil 3-1 is present to the position at which the sub coil 4-1 is present to obtain an arrangement of the sub coils 6-1-1 and 6-1-2 as shown in FIG. 10B, an electromagnetic coupling is not generated. Therefore, it can be expected that the sensitivity to the deep portion of the subject 103 is further improved.

Similarly, since the sub coil 7-1 is electrically orthogonal to the sub coils 3-1 and 4-1, an electromagnetic coupling between the sub coils 3-1 and 7-1 and an electromagnetic coupling between the sub coils 4-1 and 7-1 can be suppressed to a level at which no practical problem occurs. Therefore, even when the sub coils 6-1-1 and 6-1-2 successively arranged in the y direction overlap each other in the vicinity of a plane including the sub coil 3-1 or the sub coil 4-1, the electromagnetic coupling is suppressed to a level at which no practical problem occurs. Similarly, even when the sub coils 7-1-1 and 7-1-2 successively arranged in the y direction overlap each other in the vicinity of a plane including the sub coil 3-1 or the sub coil 4-1, the electromagnetic coupling is suppressed to a level at which no practical problem occurs.

In this way, the arrangements of the first type of sub coil 3-1, the second type of sub coil 4-1, the fourth type of sub coil 6-1, and the fifth type of sub coil 7-1 are in the appropriate relationship described above to each other, and the overlapping method is used, to remove the electromagnetic couplings. When necessary, a known decoupling method, for example, a method for using a low input impedance amplifier for signal detection to suppress a magnetic coupling may be used.

Figure 10C:
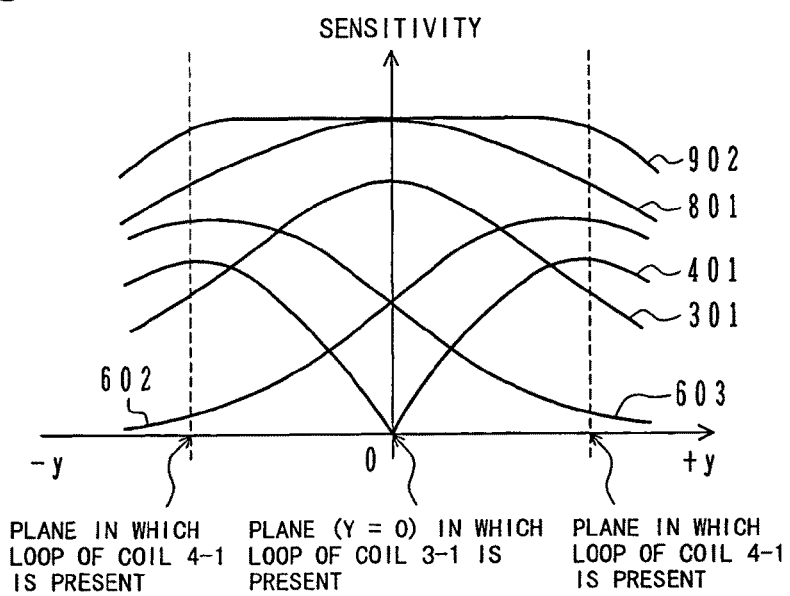
FIG. 10C is a graph showing the arrangement of the first, second, and fourth types of sub coils and characteristics of the first, second, and fourth types of sub coils.

The orthogonality of the sub coil 3-1 and the sub coils 4-1 and 6-1 is used to allow the sensitivity to the deep portion of the subject 103 to be improved. FIG. 10C shows sensitivity distributions in the y direction. The curved lines 301 and 401 indicate the sensitivity distribution of the sub coil 3-1 in the y direction and the sensitivity distribution of the sub coil 4-1 in the y direction, respectively, and are the same as those shown in FIG. 5C. Curved lines 602 and 603 indicate the sensitivity distribution of the sub coil 6-1-1 in the y direction and the sensitivity distribution of the sub coil 6-1-2 in the y direction, shown in FIG. 8B, respectively. A curved line 801 indicates a sensitivity distribution in the y direction when the sensitivity is improved by performing QD (quadrature) synthesis for the sub coil 3-1 and sub coils 6-1-1 and 6-1-2. A sensitivity distribution obtained by combining the sensitivity distribution of the sub coil 4-1 and the sensitivity distribution indicated by the curved line 801 is indicated by a curved line 902. The first, second, fourth, and fifth types of sub coils are used to allow the sensitivity to a large area in the y direction to be improved.

Figure 11A:
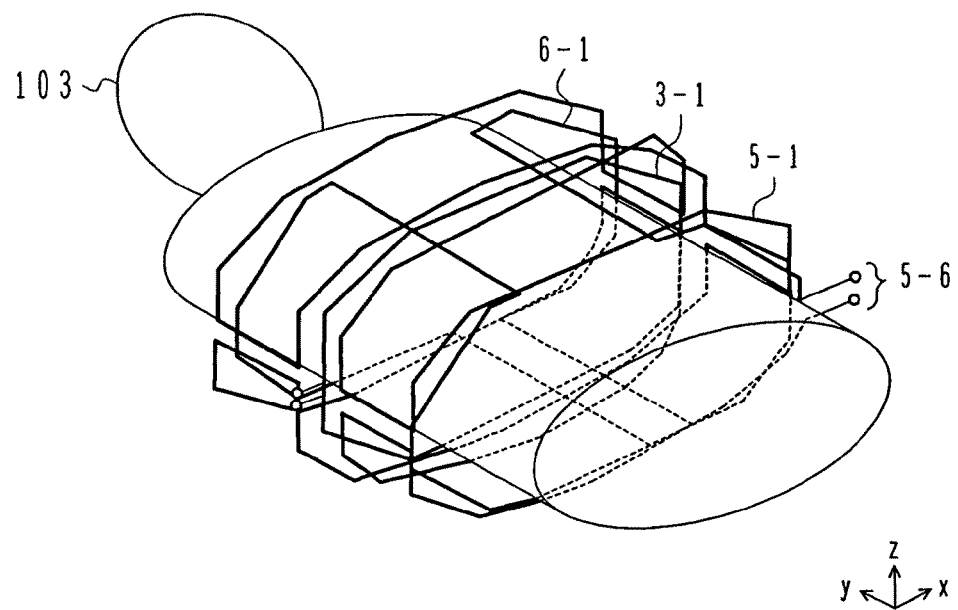
FIG. 11A is a diagram showing an arrangement of the first and third types of sub coils.
Figure 11B:
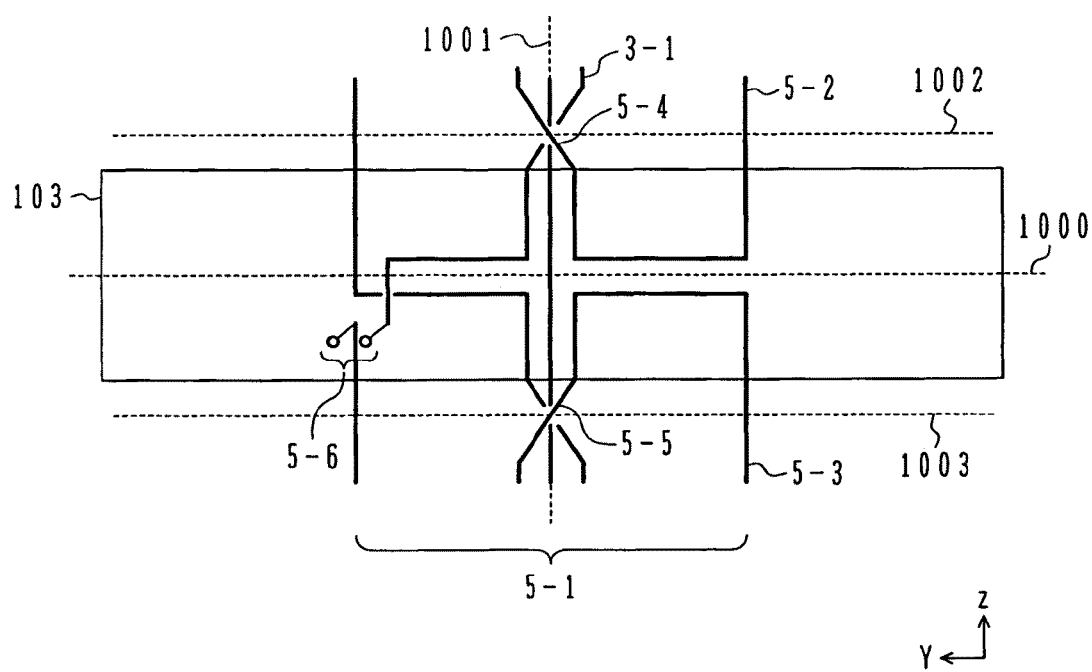
FIG. 11B is a diagram showing the arrangement of the first and third types of sub coils.

Next, a description will be made of the relationships between the third type of sub coil 5-1, and the first type of sub coil 3-1 and the second type of sub coil 4-1, of which the direction of the maximum sensitivity is the y direction, and the relationships between the third type of sub coil 5-1, and the fourth type of sub coil 6-1 and the fifth type of sub coil 7-1, of which the direction of the maximum sensitivity is the x direction. FIGS. 11A and 11B show an arrangement of the sub coils 3-1, 5-1, and 6-1 that constitute one block of the receiving coil.

As described above, the third type of sub coil 5-1 is configured by arranging the coils 5-2 and 5-3 having shapes similar to each other, and has the two current loops. The coils 5-2 and 5-3 have respective cross points and are arranged symmetrically with respect to a plane (x-y plane) 1000 perpendicular to the static magnetic field. The coils 5-2 and 5-3 are conducted to each other. The two current loops are located substantially in planes 1002 and 1003 (on the front and back sides of the subject 103), respectively. The planes 1002 and 1003 are parallel to the plane 1000. Cross points 5-4 and 5-5 of the coils are located in a plane 1001 in which the current loop of the first type of sub coil 3-1 is provided. That is, the points 5-4 and 5-5 of the coils are located in a plane including an axis substantially parallel to the direction of the static magnetic field. In this configuration, the current loops in which currents certainly flow in directions opposite to each other are present at positions symmetrical to the plane (x-y plane) 1000 perpendicular to the static magnetic field and to a plane (the z-x plane 1001 having a y coordinate of 0, or a y-z plane having an x coordinate of 0) including the original point and parallel to the static magnetic field. This configuration makes it possible to remove an electromagnetic coupling between the sub coil 5-1 and any of the sub coils other than the sub coil 5-1, as discussed in detail below. In addition, a combination of the sub coil 5-1 and any of the sub coils other than the sub coil 5-1 can improve the G factor.

Figure 12A:
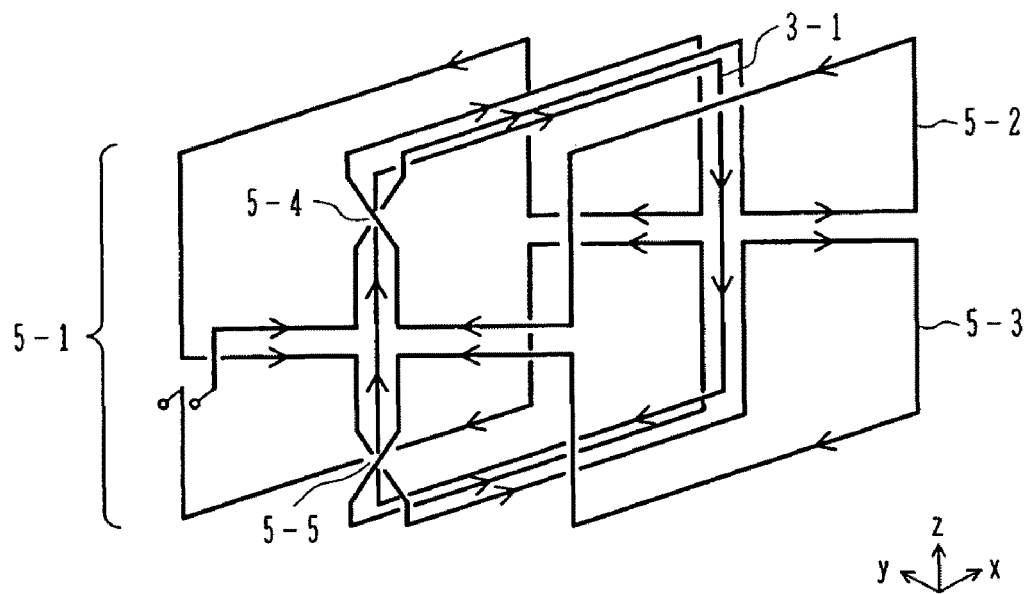
FIG. 12A is a diagram showing electromagnetic characteristics of the first and third types of sub coils.

First, the relationship between the first type of sub coil 3-1 and the third type of sub coil 5-1 is described with reference to FIG. 12A. FIG. 12A is a schematic diagram showing the case where the first type of sub coil 3-1 and the third type of sub coil 5-1 are arranged in the abovementioned manner. Also, FIG. 12A shows directions of currents flowing in the sub coils 3-1 and 5-1. When a current is supplied to the sub coil 3-1, the current flows in the current loop of the sub coil 3-1 in directions indicated by arrows shown in FIG. 12A. As apparent from FIG. 12A, even when an induced current flows in the current loop of the sub coil 5-1 that is located in the vicinity of the current loop of the sub coil 3-1, the current loops of the sub coil 5-1 are located symmetrically with respect to the plane (x-y plane having a z coordinate of 0) 1000 passing the original point and perpendicular to the static magnetic field or with respect to the plane (z-x plane 1001 having a y coordinate of 0, or y-z plane having an x coordinate of 0) passing the original point and parallel to the static magnetic field, and currents flow in the current loops of the sub coil 5-1 and in directions opposite to each other. As a result, an induced current does not flow. When a current is supplied to the sub coil 5-1, currents flow in the current loops of the sub coil 5-1 and in directions indicated by arrows shown in FIG. 12A. An induced current does not flow in the sub coil 3-1, similarly to the case where the current is supplied to the sub coil 3-1.

Figure 12B:
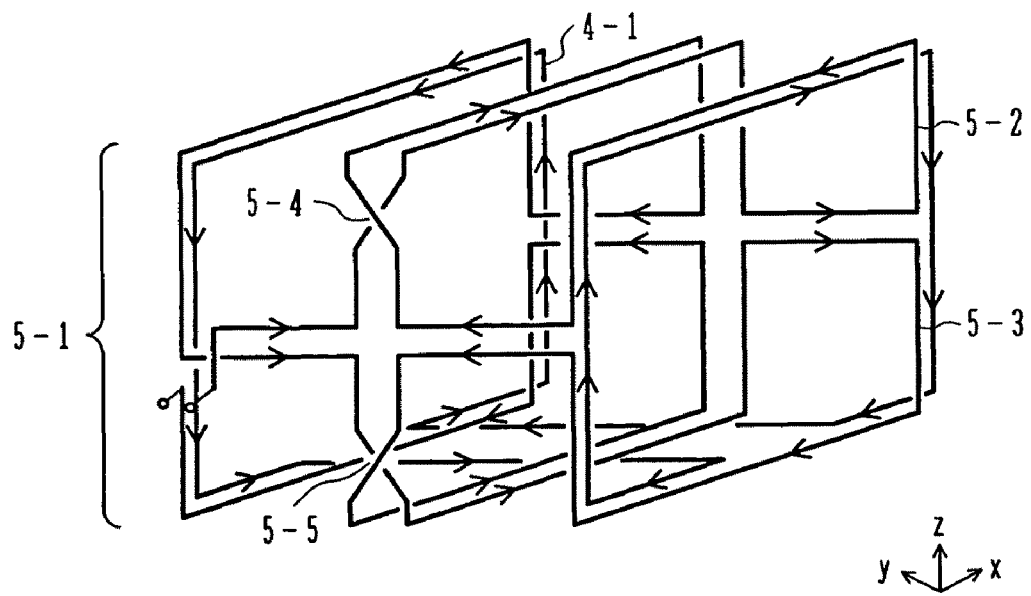
FIG. 12B is a diagram showing electromagnetic characteristics of the second and third types of sub coils.

Next, the relationship between the second type of sub coil 4-1 and the third type of sub coil 5-1 is described with reference to FIG. 12B. FIG. 12B is a schematic diagram showing the case where the second type of sub coil 4-1 and the third type of sub coil 5-1 that are arranged in the abovementioned way. Also, FIG. 12B shows directions of currents flowing in the sub coils 4-1 and 5-1. It is assumed that when a current is supplied to the sub coil 4-1, currents flow in the current loops of the sub coil 4-1 in directions indicated by arrows shown in FIG. 12B. Based on the assumption, even when induced currents flow in the current loops of the sub coil 5-1 that is located in the vicinity of the current loop of the sub coil 4-1, the current loops of the sub coil 5-1 are located symmetrically with respect to the plane (x-y plane having a z coordinate of 0) 1000 passing the original point and perpendicular to the static magnetic field or with respect to the plane (z-x plane 1001 having a y coordinate of 0, or y-z plane having an x coordinate of 0) passing the original point and parallel to the static magnetic field, and currents flow in the current loops of the sub coil 5-1 in directions opposite to each other, similarly to the case shown in FIG. 12A. As a result, an induced current does not flow. When a current is supplied to the sub coil 5-1, currents flow in the current loops of the sub coil 5-1 in directions indicated by arrows shown in FIG. 12B. An induced current does not flow in the sub coil 4-1, similarly to the case where the current is supplied to the sub coil 4-1.

The direction of the maximum sensitivity of the fourth type of sub coil 6-1 and the direction of the maximum sensitivity of the fifth type of the sub coil 7-1 are the x direction. An electromagnetic coupling between the fourth type of sub coil 6-1 and the fifth type of the sub coil 7-1 can be suppressed to a level at which no practical problem occurs. When the sub coils 5-1 are successively arranged in the y direction, the sub coils 5-1 adjacent to each other adequately overlap each other (about 10% of the area of each sub coil is overlapped) to ensure that an electromagnetic coupling between the adjacent coils can be removed.

In the receiving coil having the abovementioned configuration according to the embodiment, electromagnetic couplings generated by the five types of sub coils can be suppressed. Therefore, an auxiliary coil or the like used to remove the electromagnetic couplings is not required. Alternatively, the number of auxiliary coils or the like used to remove the electromagnetic couplings can be minimized. This suppresses an increase in the number of channels. In addition, the five types of sub coils may be combined and treated as one block. A plurality of groups of the five types of sub coils treated as one block can be arranged in the direction of the body axis of the subject 103. In this case, the sensitivity to the deep portion of the subject 103 is high, while it is possible to image a large area such as the whole body.

As described above, FIGS. 5C, 7D, and 8C show the sensitivity distributions of the sub coils. A combination of the sub coils exhibiting the different sensitivity distributions in the x, y, and z directions can be set. Thus, even when any direction is selected as the phase encoding direction, the G factor can be reduced. Even when the parallel imaging is applied to the MRI apparatus, an excellent image can be obtained. Especially, even when any direction is selected as the phase encoding direction in a cross section (that is to be imaged and in which the first type of sub coil (that is a large FOV coil) is present), the G factor can be reduced.

When an increase in the number of the channels is permitted, the G factor can be improved. For example, when the sub coils (constituting one block of the receiving coil) having eight channels are arranged in the direction of the body axis of the subject in order to image the whole body of the subject, an increase in the number of the channels is not preferable. Due to the limitation of the manufacturing accuracy, it is difficult that the positions of the cross point 5-4 and the cross point 5-5 perfectly matches the plane 1001 in which the current loop of the sub coil 3-1 (large FOV coil) is present. It is therefore preferable that the cross point 5-4 and the cross point 5-5 be positioned within approximately 20% of the length (measured in the y direction) of the sub coil 5-1 from the plane 1001. Even when the cross point 5-4 and the cross point 5-5 are shifted from the plane 1001 by approximately 20% of the length (measured in the y direction) of the sub coil 5-1 due to the limitation of the implementation, it can be expected the G factor is improved.

Figure 13A:
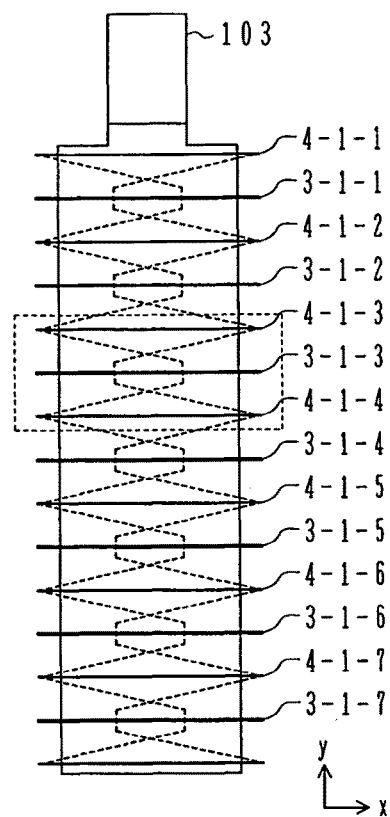
FIG. 13A is a diagram showing an example of an arrangement of the receiving coil in the case where a whole-body receiving coil is applied to the receiving coil according to the present invention.
Figure 13B:
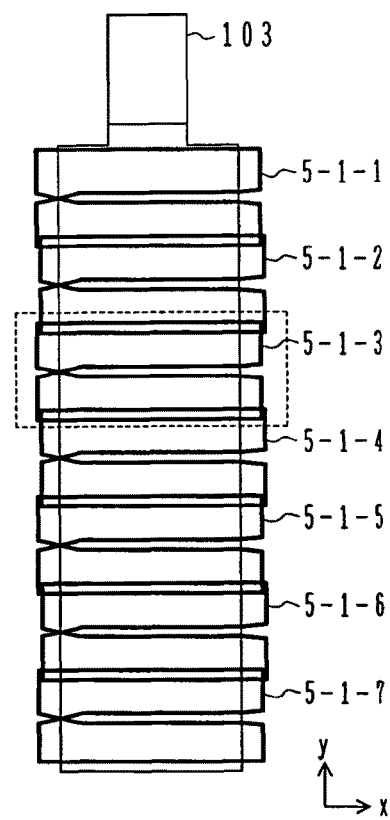
FIG. 13B is a diagram showing the example of the arrangement of the receiving coil in the case where the whole-body receiving coil is applied to the receiving coil according to the present invention.
Figure 13C:
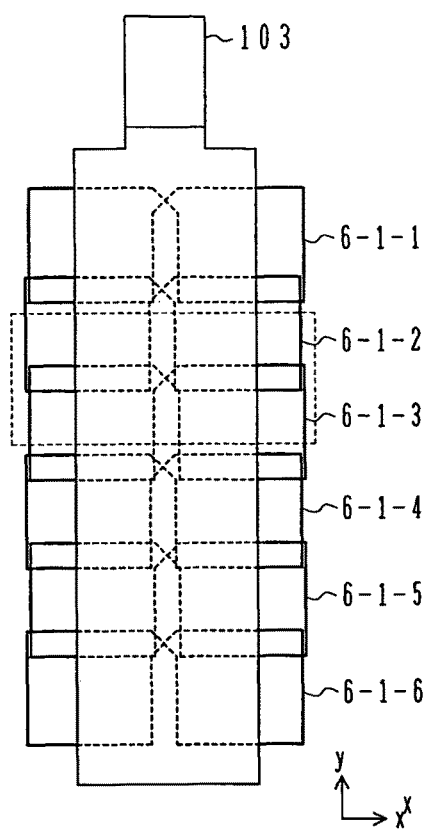
FIG. 13C is a diagram showing the example of the arrangement of the receiving coil in the case where the whole-body receiving coil is applied to the receiving coil according to the present invention.
Figure 13D:
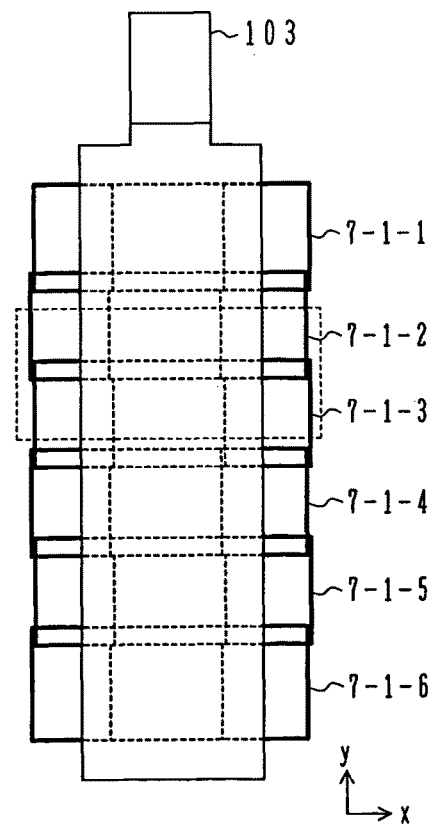
FIG. 13D is a diagram showing the example of the arrangement of the receiving coil in the case where the whole-body receiving coil is applied to the receiving coil according to the present invention.
Figure 14A:
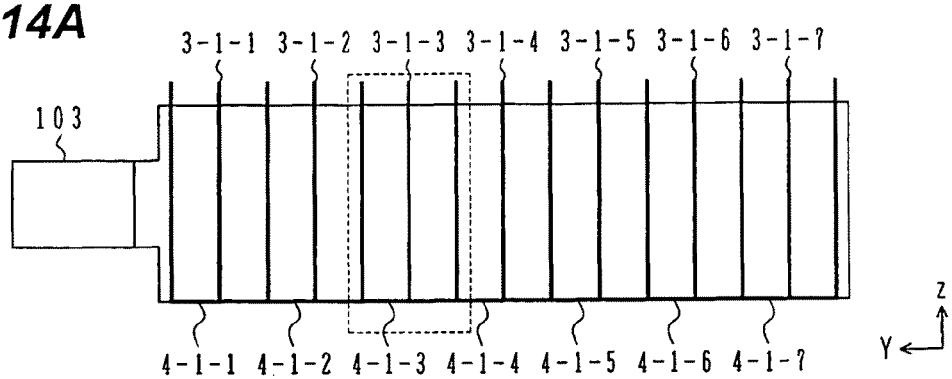
FIG. 14A is a diagram showing the example of the arrangement of the receiving coil in the case where the whole-body receiving coil is applied to the receiving coil according to the present invention.
Figure 14B:
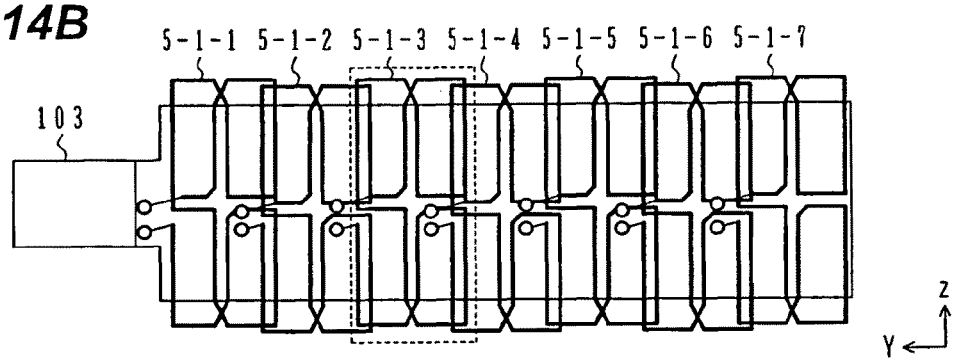
FIG. 14B is a diagram showing the example of the arrangement of the receiving coil in the case where the whole-body receiving coil is applied to the receiving coil according to the present invention.
Figure 14C:
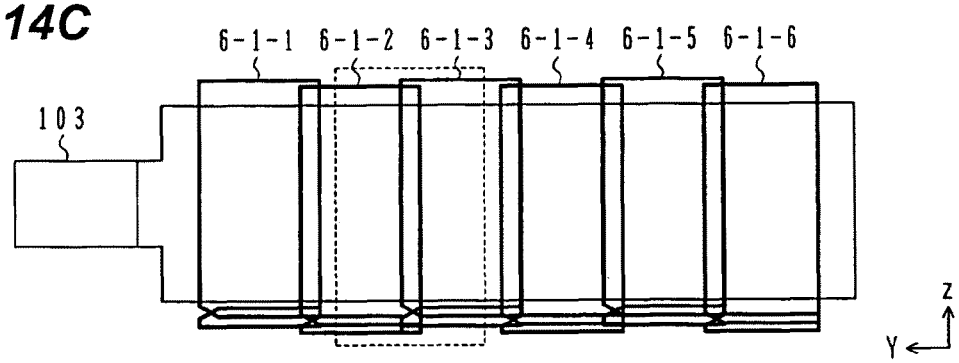
FIG. 14C is a diagram showing the example of the arrangement of the receiving coil in the case where the whole-body receiving coil is applied to the receiving coil according to the present invention.
Figure 14D:
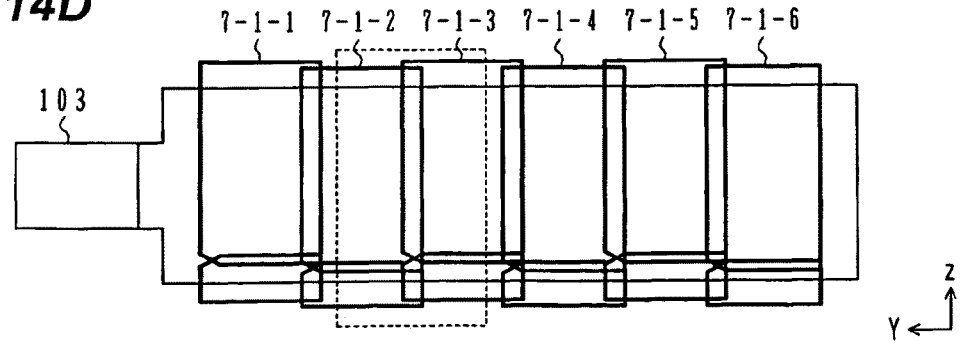
FIG. 14D is a diagram showing the example of the arrangement of the receiving coil in the case where the whole-body receiving coil is applied to the receiving coil according to the present invention.

The arrangement of the one block of the receiving coil according to the embodiment is described above. Next, a description will be made of the receiving coil composed of the five types of sub coils that are successively arranged in the direction (y direction in this case) of the body axis of the subject and cover the whole body of the subject. Each of FIGS. 13A to 14D shows an example of a successive arrangement of the five types of sub coils. FIGS. 13A to 13D are plan views of the x-y planes when viewed from the z direction. FIGS. 14A to 14D are plan views of the y-z planes when viewed from the x direction. Each of FIGS. 13A and 14A shows an arrangement of the sub coils 3-1 and 4-1. Each of FIGS. 13B and 14B shows an arrangement of the sub coils 5-1. Each of FIGS. 13C and 14C shows an arrangement of the sub coils 6-1. Each of the FIGS. 13D and 14D shows an arrangement of the sub coils 7-1. The drawings of FIGS. 13A to 14D are separately shown for clarification. One block surrounded by a dotted line shown in each of FIGS. 13A to 14D is treated as a common block. The sub coils present in the common block shown in each of FIGS. 13A to 14D are arranged to ensure that the positional relationship shown in FIGS. 3A to 3D with respect to the subject 103 is obtained.

As shown in FIGS. 13B to 13D and 14B to 14D, the lengths of the sub coils 5-1, 6-1, and 7-1 in the y direction are nearly equal to each other. A portion (having an appropriate area) of any one of the sub coils 5-1 overlaps a portion (having an appropriate area) of the sub coil 5-1 adjacent to the one of the sub coils 5-1 to ensure that the sub coils 5-1 can be successively arranged. A portion (having an appropriate area) of any one of the sub coils 6-1 overlaps a portion (having an appropriate area) of the sub coil 6-1 adjacent to the one of the sub coils 6-1 to ensure that the sub coils 6-1 can be successively arranged. Also, a portion (having an appropriate area) of any one of the sub coils 7-1 overlaps a portion (having an appropriate area) of the sub coil 7-1 adjacent to the one of the sub coils 7-1 to ensure that the sub coils 7-1 can be successively arranged. Especially, since the sub coils 6-1 are arranged with the sub coils 3-1 and 4-1 to improve the sensitivity to the deep portion of the subject, the adjacent sub coils overlap each other to always maintain high sensitivity in the y direction. When the sub coils 3-1 and 4-1 shown in FIGS. 13A and 14A are operated in the state shown in FIGS. 13A and 14A, an electromagnetic coupling between the adjacent sub coils is extremely large. Even when a known method (for example, a method for using an amplifier having low input impedance for signal detection to suppress a magnetic coupling) is used, the magnetic coupling cannot be sufficiently suppressed. Thus, the sub coils 3-1 and 4-1 are set to ensure that one of the sub coils 3-1 and one of the sub coils 4-1 are present in a single imaging block. The sub coils 4-1-1 and 4-1-2 combined with the two sub coils 3-1 (for example, the sub coils 3-1-1 and 3-1-2) can share conductor portions sandwiched by the sub coils 3-1-1 and 3-1-2. This configuration is described in detail later with control of the sub coils of receiving coil according to the embodiment.

Figure 15A:
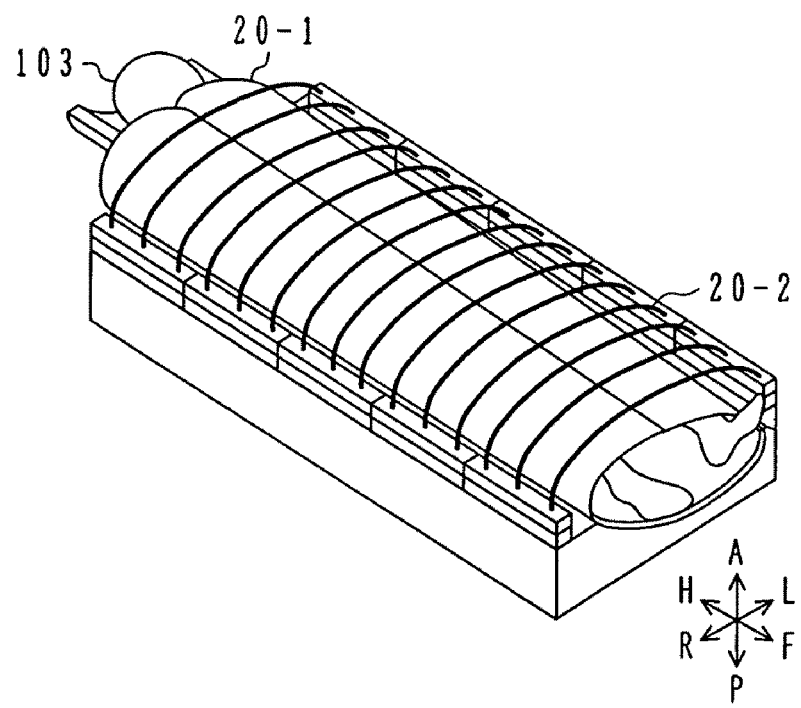
FIG. 15A is a diagram showing a structure for setting the whole-body receiving coil.
Figure 15B:
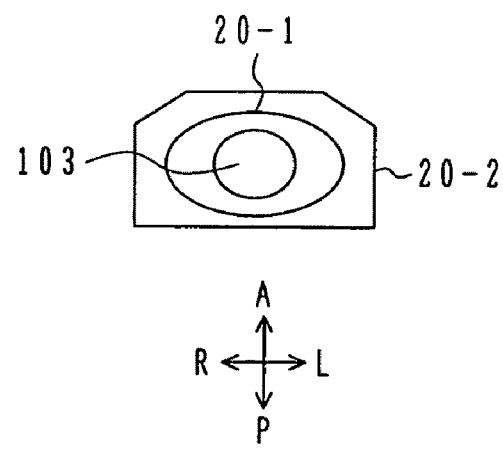
FIG. 15B is a diagram showing the structure for setting the whole-body receiving coil.
Figure 15C:
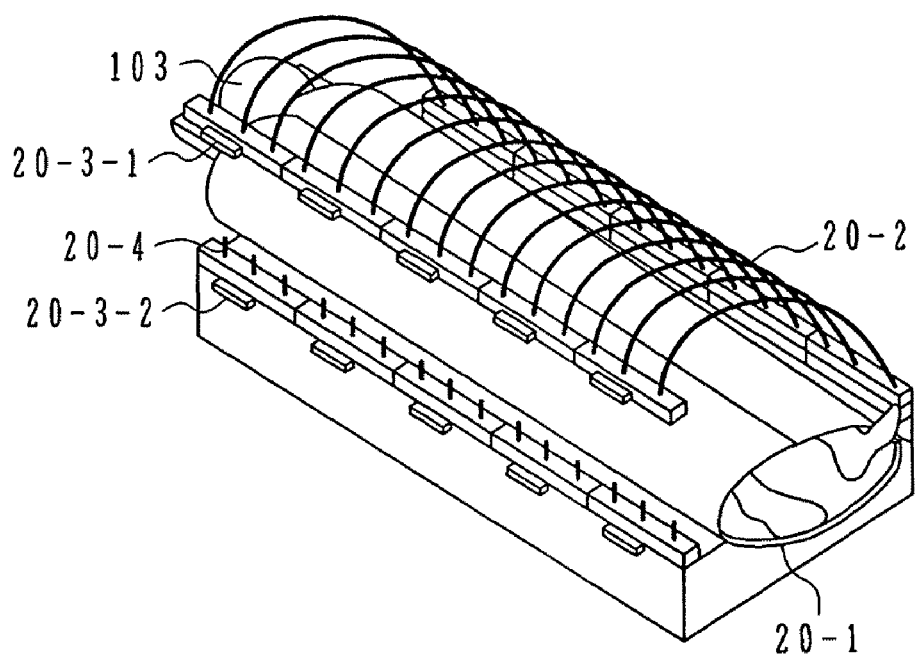
FIG. 15C is a diagram showing the structure for setting the whole-body receiving coil.
Figure 15D:
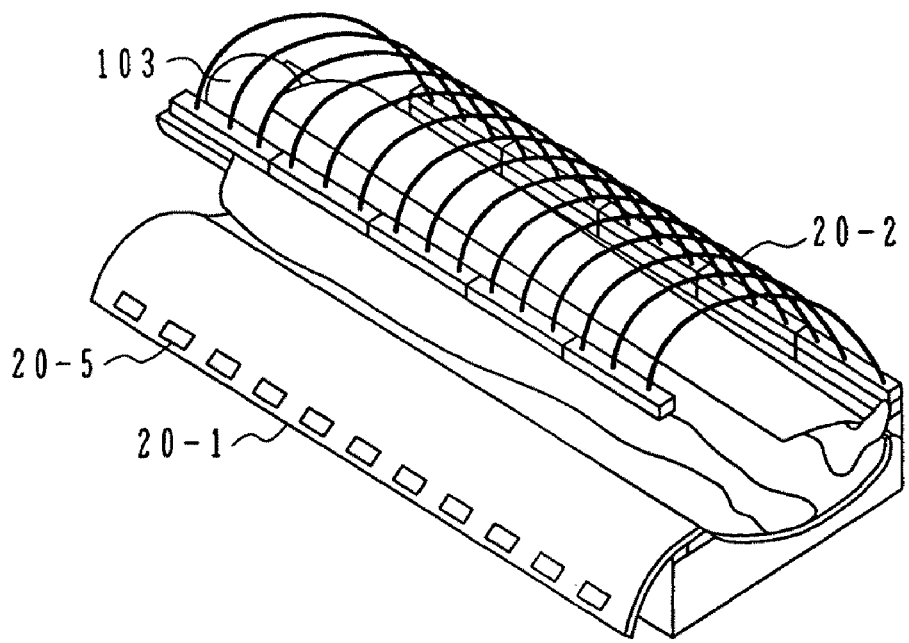
FIG. 15D is a diagram showing the structure for setting the whole-body receiving coil.

Next, a description will be made of the structure (for setting the receiving coil for the subject) of the receiving coil according to the embodiment when the receiving coil is a whole-body receiving coil. FIGS. 15A to 15D show the receiving coil according to the embodiment of the present invention. The receiving coil shown in FIGS. 15A to 15D has an outer-side base 20-2 and an inner-side base 20-1, i.e., has a double base structure. The bases 20-2 and 20-1 hold the coil conductors of the receiving coil. As shown in FIG. 15C, the outer-side base 20-2 can be divided into two portions: the portion on the front side of the subject; and the portion on the back side of the subject. The outer-side base 20-2 can be open from one side of the subject. As shown in FIG. 15D, the inner-side base 20-1 can be open from the front side (when the subject lies on his back) of the subject 103 to both sides of the subject 103. In this configuration, the receiving coil can be easily set for the subject.

The inner-side base 20-1 has a flexible sheet shape and holds the sub coils 6-1 and 7-1, for example. Each of the sub coils 6-1 and 7-1 does not have a coil pattern (conductor) on the front side of the subject. Therefore, each of the sub coils 6-1 and 7-1 can be configured to be open to both sides of the subject in a region in which the sub coil does not have a coil pattern. An end portion of the base 20-1, which is used to close the base 20-1, preferably has a fixture 20-5. The fixture 20-5 allows the receiving coil to be stably set for the subject 103. Since the inner-side base 20-1 has the flexible sheet shape, feeling of pressure against the subject 103 can be reduced.

The outer-side base 20-2 holds the sub coils 3-1 and 4-1, for example. A divided portion of the base 20-2 includes a connector 20-4 and fixtures 20-3-1 and 20-3-2. This structure of the base 20-2 makes it easy to divide the base 20-2 and set the receiving coil. In FIGS. 15C and 15D, the base 20-2 is in an entirely open state. The base 20-2, however, may be openable and closable on a single block basis.

In the whole-body receiving coil according to the embodiment, the inner-side base 20-1 is made of a flexible material, and the outer-side base 20-2 is slightly distant from the subject 103. The bases 20-1 and 20-2 entirely cover the subject 103. This structure of the whole body receiving coil can maximize an advantage of reducing the feeling of pressure against the subject 103 in the vertical magnetic field MRI apparatus. Since the inner-side base 20-1 is made of the flexible material, any one of subjects that are to be imaged and have different sizes can adhere to the inner-side base 20-1. In addition, when the outer-side bases 20-2 having respective lower portions (on the back side of the subject) with the same size and respective upper portions (on the front side of the subject) with different sizes from each other are prepared, any one of subjects that are to be imaged and have different sizes can be set in the outer-side bases 20-2.

Next, a description will be made of a control method in the case where the whole-body receiving coil described above is used to image the whole body of the subject. Typically, a region to be imaged is divided into a plurality of blocks in the direction (y direction in the case where the vertical magnetic field MRI is performed) of the body axis of the subject to image the whole body of the subject. The MRI apparatus according to the present invention switches between the sub coils of the whole-body receiving coil and controls the receiving coil to ensure that only a sub coil included in an imaging block operates.

Figure 16A:
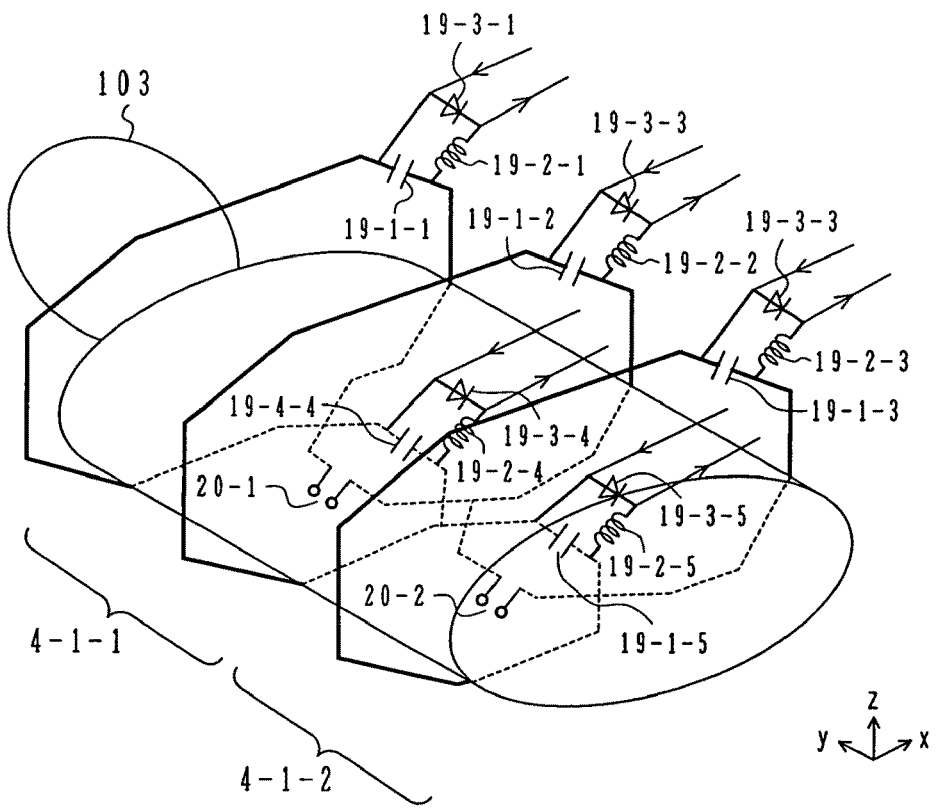
FIG. 16A is a diagram showing a switching circuit for the first type of sub coil and a switching circuit for the second type of sub coil.
Figure 16B:
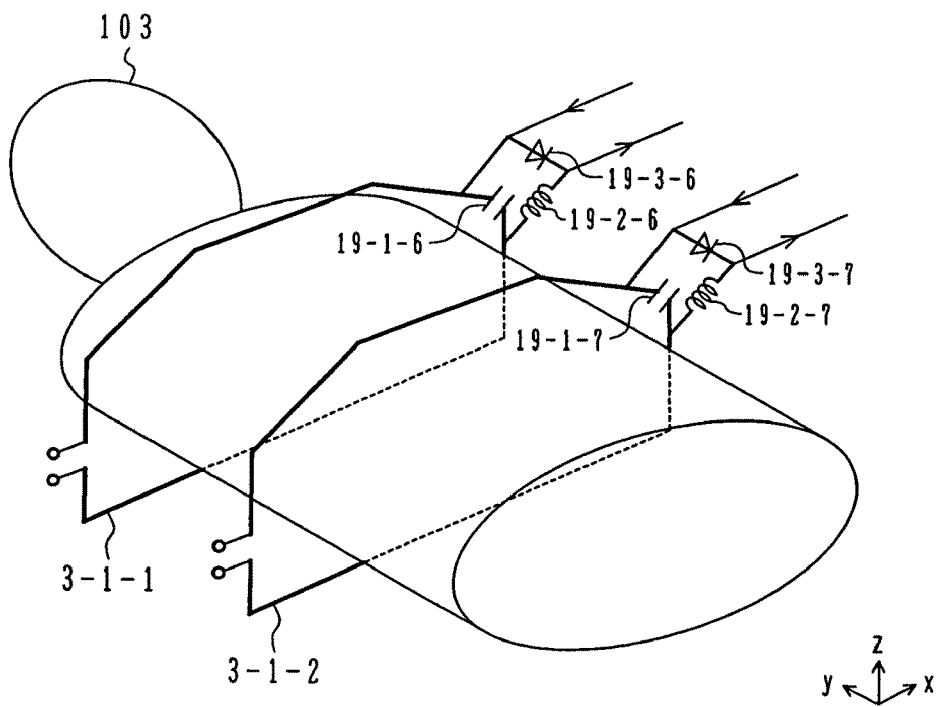
FIG. 16B is a diagram showing a switching circuit for the first type of sub coil and a switching circuit for the second type of sub coil.

FIGS. 16A and 16B show examples of the configurations of the sub coils 4-1 and 3-1, respectively. The sub coil 3-1 shown in FIG. 16B has switch circuits, and the sub coil 4-1 shown in FIG. 16A has switch circuits. FIG. 16A shows the sub coil 4-1 (4-1-1 and 4-1-2) for two blocks. The sub coil 4-1 shown in FIG. 16A has three current loops that surround the circumference of the subject 103. The current loop of the sub coil 4-1 shown in FIG. 16A, which is located between the other current loops of the sub coil 4-1 shown in FIG. 16A, is shared by the sub coils 4-1-1 and 4-1-2. That is, the current loop on the left side of the drawing and the current loop at the center constitute the sub coil 4-1-1. The current loop on the right side of the drawing and the current loop at the center constitute the sub coil 4-1-2. Each of feeding points 20-1 and 20-2 is connected with a preamplifier (not shown). When a nuclear magnetic resonance signal generated from the subject 103 is received, the nuclear magnetic resonance signal is amplified by the preamplifier. Then, the nuclear magnetic resonance signal is detected and converted into a digital signal. The converted digital signal is then processed. In addition, capacitances 19-1 (19-1-1 to 19-1-5) are connected with the current loops and connection portions of the current loops, respectively. In this case, the capacitances 19-1 are connected in parallel with respect to the current loops. The capacitances 19-1 and inductances 19-2 (19-2-1 to 19-2-5) constitute loop circuits. Values of the capacitances 19-1 and values of the inductances 19-2 are controlled to ensure that the loop circuits resonate at a resonance frequency. The loop circuits respectively have switch circuits 19-3 (19-3-1 to 19-3-5) that are used to cause the respective current loops to stop the operations.

In this configuration, when a direct current flows in the switch circuit 19-3 for the sub coil 4-1, the switch circuit 19-3 becomes in a conducting state. The loop circuit forms a resonance circuit to obtain a state similar to the state where an element having high resistance is provided in the capacitance 19-1. Then, a high frequency current does not flow in the sub coil 4-1 itself. That is, the nuclear magnetic resonance signal generated from the subject is not received by the receiving coil. On the other hand, since the switch circuit 19-3 in which a direct current does not flow is in an open state, the capacitance 19-1 and the inductance 19-2 (that are connected in parallel with respect to the sub coil 4-1) do not form a loop circuit. The sub coil 4-1 and the capacitance 19-1 form an RF receiving coil. That is, the nuclear magnetic resonance signal generated from the subject is received by the receiving coil.

For example, when the switch circuits 19-3-1 to 19-3-5 are controlled to ensure that a direct current does not flow in the switch circuits 19-3-1, 19-3-2, and 19-3-4 and direct currents flow in the 19-3-3 and 19-3-5, the sub coil 4-1-1 operates as the receiving coil. However, the sub coil 4-1-2 can be controlled not to operate as the receiving coil. That is, an electromagnetic coupling is not generated between the sub coils 4-1-1 and 4-1-2.

Similarly, in the sub coil 3-1 shown in FIG. 16B when the switch circuits 19-3-6 and 19-3-7 are controlled to ensure that a direct current does not flow in the switch circuit 19-3-6 and flows in the switch circuit 19-3-7, the sub coil 3-1-1 operates as the receiving coil, for example. However, the sub coil 3-1-2 can be controlled not to operate as the receiving coil. In addition, each of other types of sub coils 5-1, 6-1, and 7-1 has a switch circuit 19-3, a capacitance 19-1, and an inductance 19-2 for its current loop(s), and is controlled to ensure that a direct current flows in the switch circuit 19-3 when RF irradiation is performed, for example. This configuration prevents the coils and a reception system circuit from being broken due to the RF irradiation and prevents a coupling between a receiving side and a transmitting side.

When any of the whole-body receiving coils shown in FIGS. 13A to 14D is used, it is preferable that one of the sub coils 3-1, one of the sub coils 4-1, two of the sub coils 5-1, two of the sub coils 6-1, and two of the sub coils 7-1 be operated based on a region to be imaged, and that the other sub coils be not operated. That is, it is preferable that the sub coils forming eight channels are operated.

Figure 17:
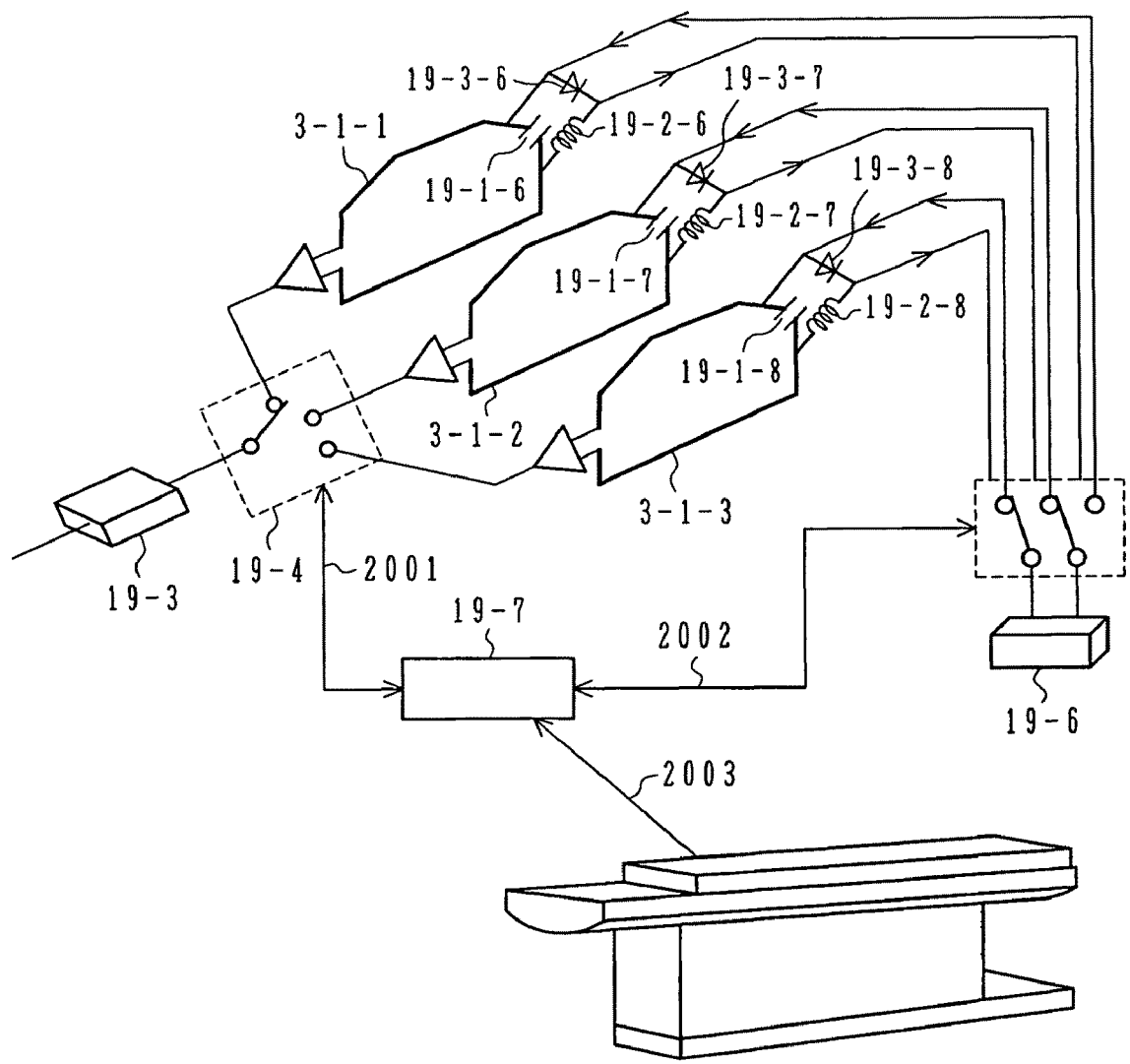
FIG. 17 is a diagram showing a control system for the receiving coil according to the present invention.

FIG. 17 shows an example of the configuration of a control system for the receiving coil. In FIG. 17, only the sub coils 3-1 are shown as representative receiving coils. However, any of the other types of sub coils can be configured in a similar way. The control system is mainly composed of a selection circuit 19-4, a DC power supply switch 19-6 and a controller 19-7. The selection circuit 19-4 is operable to selectively connect the sub coils to a detection circuit 19-5. The DC power supply switch 19-6 is operable to switch a control signal to be transmitted to a switch circuit 19-3 that is provided for each of the sub coils.

The selection circuit 19-4 is provided between the detection circuit 19-5 and the preamplifier. The preamplifier is connected to feeding points of the sub coils. When a signal 2001 is transmitted from the controller 19-7 based on a region to be imaged, the sub coil corresponding to the region to be imaged is selectively connected to the detection circuit 19-5. When the controller 19-7 transmits to the DC power supply switch 19-6 a control signal 2002 based on the region to be imaged, the DC power supply switch 19-6 is controlled based on the signal to ensure that a direct current flows in the switch circuit 19-3 of the sub coil that is in a non-operating state. The controller 19-7 synchronizes the control signal 2001 (to be used by the selection circuit 19-4 to select an operating sub coil) with the control signal 2002 (to be transmitted to the DC power supply switch 19-6) and transmits the control signals. For example, a position detection unit may be provided for a bed or a table that moves. In this case, a trigger signal 2003 based on the position of the bed or the table is transmitted to the controller 19-7, and the controller 19-7 performs control based on the trigger signal 2003.

In this configuration, any of the sub coils, which become(s) in an operating state, receives a nuclear magnetic resonance signal from the subject. The nuclear magnetic resonance signal is amplified by the preamplifier connected to the feeding point and is then transmitted to the detection circuit 19-5. In this case, a signal received by any of the sub coils that are not present in the region to be imaged is not transmitted to the detection circuit 19-5. A single detection circuit can simultaneously process signals received by a plurality of the sub coils.

Figure 18:
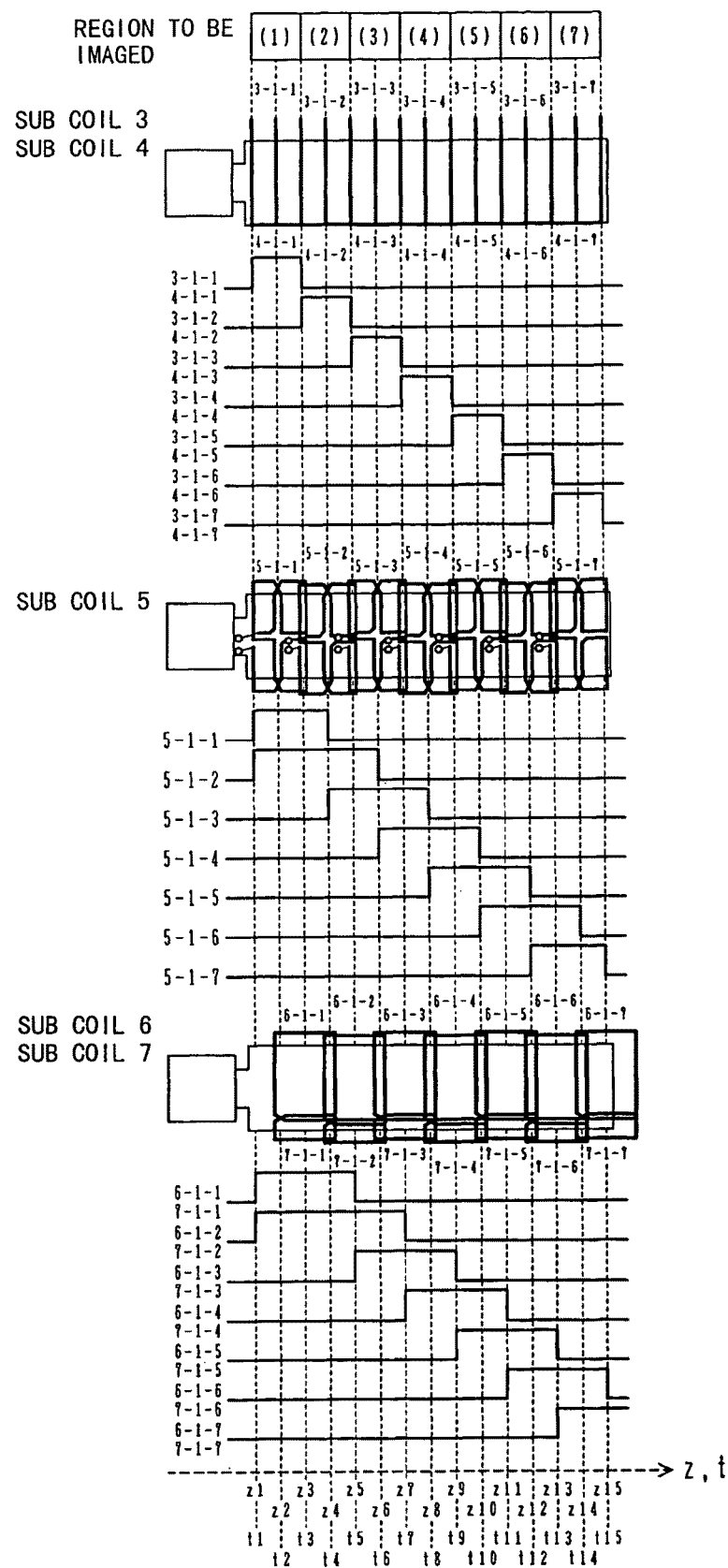
FIG. 18 is a control sequence for the receiving coil according to the present invention.

Next, a description will be made of a detail example of the coil control of the case where the receiving coil according to the present embodiment is used to image the subject while a table mounting the subject thereon moves. In the process of imaging the subject placed on the moving table by using the receiving coil according to the present embodiment, the state of the operation of each sub coil is selectively switched based on a region to be imaged. FIG. 18 shows an example of a time chart of the operation of each sub coil. FIG. 18 shows the time chart in the case where the region to be imaged is divided into seven regions (1) to (7), and the seven regions (1) to (7) are sequentially switched and imaged. The timing of a rising edge (shown in the timing chart) and the timing of a falling edge (shown in the timing chart) are synchronized with each other by a trigger signal. The trigger signal is transmitted by a position detection unit when the position detection unit detects a location indicated by a dotted line. The position detection unit is attached to the moving table.

A description will be made of an example in which the regions (1), (2), and (3) are sequentially imaged. During the imaging of the region (1), the sub coils 3-1-1, 4-1-1, 5-1-1, 5-1-2, 6-1-1, 6-1-2, 7-1-1, and 7-1-2 operate. When the position detection unit attached to the moving table detects a boundary line (indicated by a dotted line z3 shown in FIG. 18) between the regions (1) and (2) to be imaged, each of the sub coils 3-1-1 and 4-1-1 becomes in a non-operating state, and each of the sub coils 3-1-2 and 4-1-2 becomes in an operating state at a timing indicated by a dotted line t3, simultaneously. During the imaging of the region (2), when the position detection unit detects a substantially central line (indicated by a dotted line z shown in FIG. 18) of the region (2), the sub coil 5-1-1 becomes in a non-operating state and the sub coil 5-1-3 becomes in an operating state at a timing indicated by a dotted line t4, simultaneously. When the position detection unit detects a boundary line (indicated by a dotted line z5 shown in FIG. 18) between the regions (2) and (3) to be imaged, each of the sub coils 6-1-1 and 7-1-1 becomes in a non-operating state and each of the sub coils 6-1-3 and 7-1-3 becomes in an operating state at a timing indicated by a dotted line t5, simultaneously. After that, at the instant when the position detection unit detects a z coordinate of a line indicated by a dotted line shown in FIG. 18, each sub coil becomes in an operating state or in a non-operating state at each timing shown in the timing chart of FIG. 18. It should be noted that the method for dividing the region to be imaged and the timings are not limited to those shown in FIG. 18, and may be arbitrarily set.

The structure and arrangement of the sub coils constituting one block of the whole-body receiving coil (according to the present embodiment) are described above. As described above, the whole-body receiving coil is configured by the combination of the first to five types of sub coils. Also, the structure of the whole-body receiving coil and the method for controlling the whole-body receiving coil are described above. The basic characteristic of the receiving coil according to the present invention is the following. That is, the combination of the first type of sub coil 3-1 and the second type of sub coil 5-1 suppresses an electromagnetic coupling and an increase in the number of channels. The first type of sub coil 3-1 forms the current loop around the subject. The second type of sub coil 5-1 has the two cross points that are located in the plane (standard plane) in which the current loop of the first type of sub coil is provided. The currents flow in the two current loops of the sub coil 5-1 in the directions symmetrical to a plane crossing the standard plane. A plurality of the sub coils can be arranged side by side. Also, the sub coils 3-1 and 5-1 can be combined with a different type of the sub coil. Therefore, the receiving coil according to the present invention can be variously changed while the first type of sub coil and the second type of sub coil are arranged at predetermined positions and used as the standard structure. For example, the receiving coil not having the sub coils 4-1, 6-1, and 7-1 is included in the scope of the present invention. In addition, the receiving coil having a shape changed based on a target to be imaged is included in the scope of the present invention as long as the sub coils of the receiving coil are arranged as described above.

In order to confirm an effect of the receiving coil according to the present invention, a G factor is calculated through a simulation in the case where a plurality of the sub coils is arranged and a different direction is selected as the phase encoding direction.

Figure 19A:
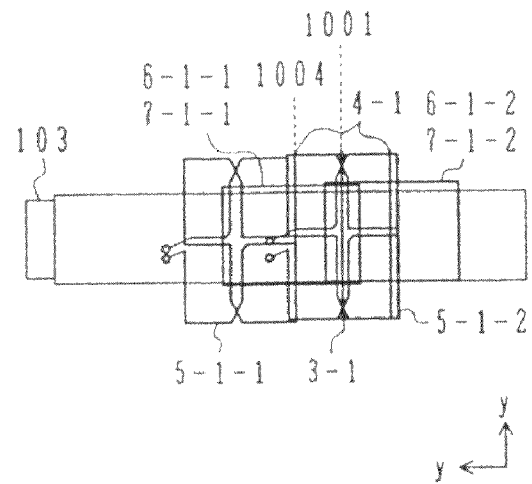
FIG. 19A is a diagram showing a G factor in the case where the receiving coil according to the embodiment of the present invention is used.
Figure 19B:
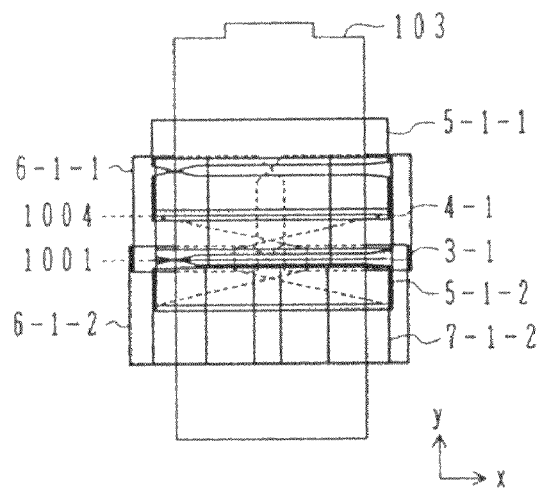
FIG. 19B is a diagram showing a G factor in the case where the receiving coil according to the embodiment of the present invention is used.
Figure 19C:
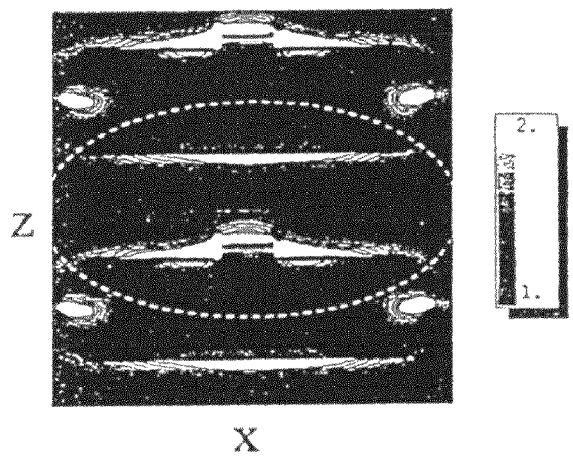
FIG. 19C is a diagram showing the G factor in the case where the receiving coil according to the embodiment of the present invention is used.
Figure 19D:
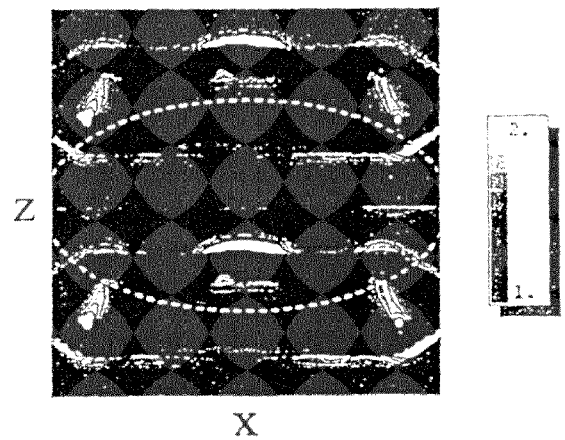
FIG. 19D is a diagram showing the G factor in the case where the receiving coil according to the embodiment of the present invention is used.
Figure 19E:
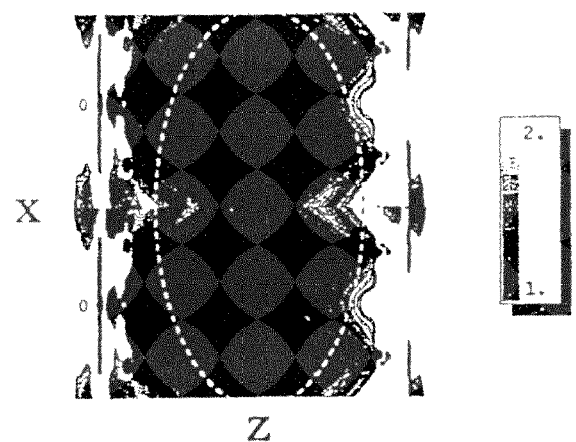
FIG. 19E is a diagram showing the G factor in the case where the receiving coil according to the embodiment of the present invention is used.
Figure 19F:
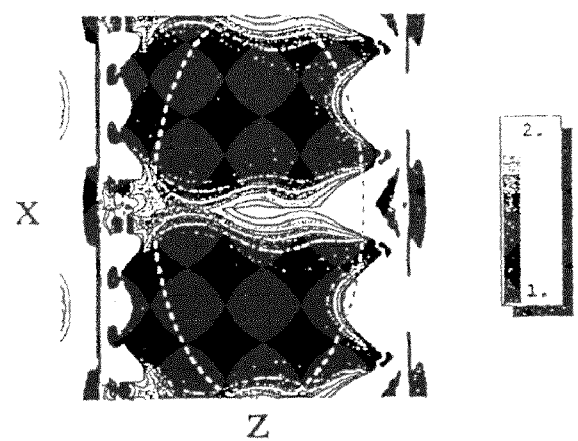
FIG. 19F is a diagram showing the G factor in the case where the receiving coil according to the embodiment of the present invention is used.

Each of FIGS. 19A and 19B shows an arrangement of the sub coils subjected to the simulation. FIGS. 19C and 19D show the simulation results of the G factor in the case where the sub coils arranged as shown in FIG. 19A are simulated. FIGS. 19E and 19F show the simulation results of the G factor in the case where the sub coils arranged as shown in FIG. 19B are simulated. FIG. 19A shows the arrangement of the sub coils in the y-z plane when viewed from the x direction. FIG. 19B shows the arrangement of the sub coils in the x-y plane when viewed from the z direction. The sub coils 3-1 and 4-1 are the same as the sub coils (denoted by the same reference numerals) of the receiving coil shown in FIGS. 3A to 3D. Sub coils 6-1-1 and 6-1-2 shown in FIGS. 19A and 19B are obtained by optimally transforming the conventional large FOV coil (saddle coil in this case) 6-1 and adequately overlap each other. Sub coils 7-1-1 and 7-1-2 shown in FIGS. 19A and 19B are obtained by optimally transforming the sub coil 7-1 exhibiting a sensitivity distribution in a right-left direction (hereinafter referred to as a RL direction, which is the x direction in this case) of the subject and adequately overlap each other. Sub coils 5-1-1 and 5-1-2 shown in FIGS. 19A and 19B are obtained by causing the two sub coils 5-1 to adequately overlap each other and arranged to ensure that the two cross points 5-4 and 5-5 of the sub coils 5-1 are located in a plane including the cross section 1001 in which the sub coil 3-1 is present. In FIGS. 19A and 19B, the cross sections 1001 and 1004 are z-x planes in which the current loops of the sub coils 3-1 and 4-1 are present, respectively.

FIG. 19C shows the simulation results of the G factor in the case where a front-back direction (that connects the back of the subject and the stomach of the subject, and is hereinafter referred to as an AP direction) (z direction in this case) of the subject is selected as the phase encoding direction in the cross section 1001. FIG. 19D shows the simulation results of the G factor in the case where a front-back direction (that connects the back of the subject and the stomach of the subject, and is hereinafter referred to as an AP direction) (z direction in this case) of the subject is selected as the phase encoding direction in the cross section 1004. FIGS. 19C and 19D two-dimensionally show each pixel value calculated by using the formula described in Non-Patent Document 2 based on a distribution of sensitivity of each sub coil. FIG. 19E shows the simulation results of the G factor in the case where the RL direction is selected as the phase encoding direction in the plane 1001. FIG. 19F shows the simulation results of the G factor in the case where the RL direction is selected as the phase encoding direction in the plane 1004. As described above, the G factor is a value of 1 or more. The G factor is an index value indicating that the arrangement of the sub coils is ideal when the G factor is close to 1. In each of FIGS. 19C to 19F, as the G factor is closer to 1, a G factor map shows that a corresponding region is closer to a black color. On the other hand, as the G factor is increased, the G factor map shows that a corresponding region is closer to a white color. When the receiving coil according to the present embodiment is used, the G factor map shown in each of FIGS. 19C to 19F indicates that an almost entire region (surrounded by a broken line shown in the drawing) in which the subject is present shows a black color. Thus, the arrangement of the sub coils is excellent as apparent from the drawings.

Comparative Example 1

Figure 20A:
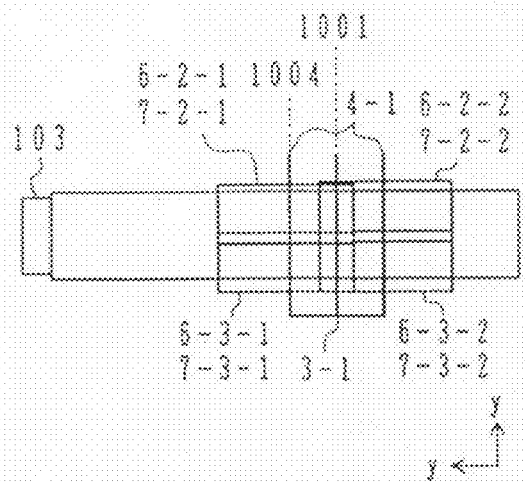
FIG. 20A is a diagram showing an example of a G factor in the case where a receiving coil according to comparative example 1 is used.
Figure 20B:
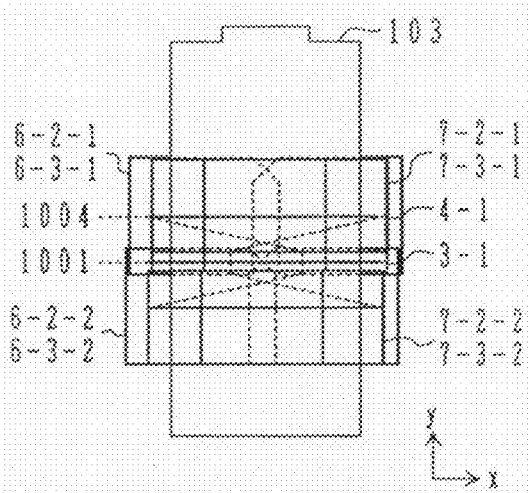
FIG. 20B is a diagram showing an example of a G factor in the case where the receiving coil according to comparative example 1 is used.
Figure 20C:
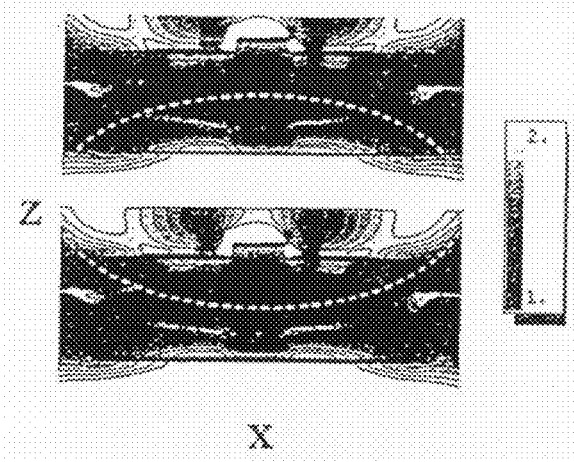
FIG. 20C is a diagram showing an example of the G factor in the case where the receiving coil according to comparative example 1 is used.
Figure 20D:
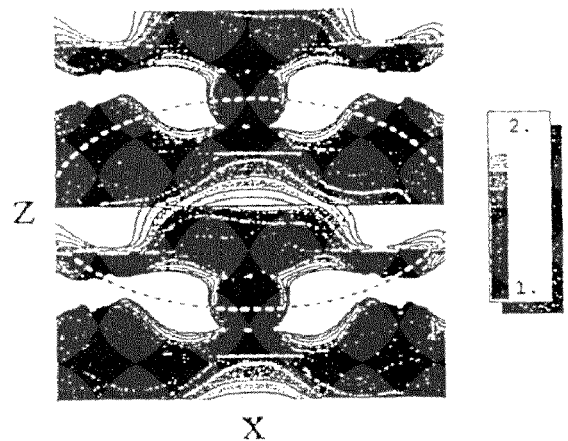
FIG. 20D is a diagram showing an example of the G factor in the case where the receiving coil according to comparative example 1 is used.
Figure 20E:
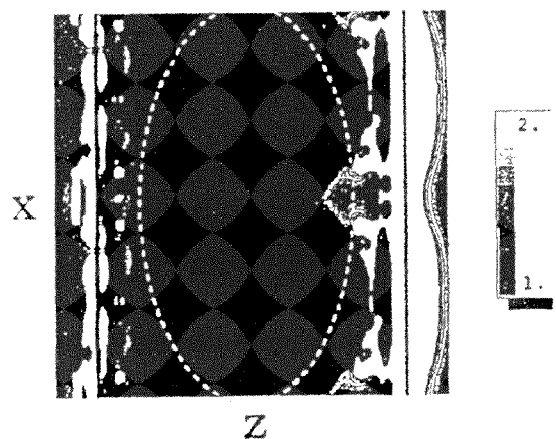
FIG. 20E is a diagram showing an example of the G factor in the case where the receiving coil according to comparative example 1 is used.
Figure 20F:
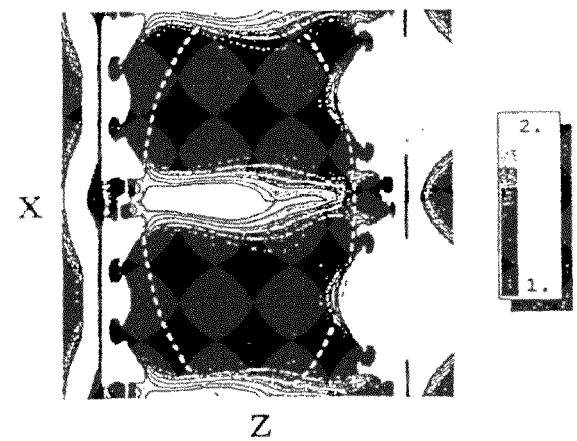
FIG. 20F is a diagram showing an example of the G factor in the case where the receiving coil according to comparative example 1 is used.

In comparative example 1, the G factor is simulated by using a receiving coil composed by a combination of sub coils that do not include sub coils corresponding to the sub coils 5-1-1 and 5-1-2 used in the embodiment. Each of FIGS. 20A and 20B shows an arrangement of the sub coils. Each of FIGS. 20C and 20D shows the G factor in the case where the sub coils are arranged as shown in FIG. 20A. Each of FIGS. 20E and 20F shows the G factor in the case where the sub coils are arranged as shown in FIG. 20B. FIG. 20A shows the arrangement of the sub coils in the y-z plane when viewed from the x direction. FIG. 20B shows the arrangement of the sub coils in the x-y plane when viewed from the z direction. The sub coils 3-1 and 4-1 are the same as the sub coils (denoted by the same reference numerals) of the receiving coil shown in FIGS. 3A to 3D. The sub coils 6-2-1, 6-2-2, 6-3-1, and 6-3-2 are surface coils (e.g., figure eight butterfly-type coils). The sub coils 7-2-1, 7-2-2, 7-3-1, and 7-3-2 are obtained by optimally transforming the sub coil 7-1 exhibiting a sensitivity distribution in the RL direction. When the sub coils adjacent to each other adequately overlap each other, an electromagnetic coupling between the adjacent sub coils is reduced. A broken line 1001 shown in FIGS. 20A and 20B denotes a plane (z-x plane) in which the current loop of the sub coil 3-1 is present. A broken line 1004 shown in FIGS. 20A and 20B denotes a plane (z-x plane) in which the current loop of the sub coil 4-1 is present.

FIG. 20C shows the simulation results of the G factor in the case where the AP direction is selected as the phase encoding direction in the cross section 1001. FIG. 20D shows the simulation results of the G factor in the case where the AP direction is selected as the phase encoding direction in the cross section 1004. FIGS. 20C and 20D two-dimensionally show each pixel value calculated by using the formula described in Non-Patent Document 2 based on a distribution of sensitivity of each sub coil. FIG. 20E shows the simulation results of the G factor in the case where the RL direction is selected as the phase encoding direction in the plane 1001. FIG. 20F shows the simulation results of the G factor in the case where the RL direction is selected as the phase encoding direction in the plane 1004. As apparent from the results shown in the drawings, a region indicating a large G factor is present in the cross sections (i.e., regions in which the subject is present) in which the sub coils 3-1 and 4-1 of the receiving coil used in comparative example 1 are present. The reason is that a large FOV receiving coil (the sub coils 3-1 and 4-1 in this case), such as a solenoid coil, has high sensitivity compared with sensitivity of one or more pairs of small FOV receiving coils (the sub coils 6-2 and 6-3 in this case) arranged in the phase encoding direction and a distribution of the sensitivity of the large FOV receiving coil is uniform.

In order to solve this problem, the sensitivity of the large FOV receiving coil (sub coils 3-1 and 4-1 in this case) is set not to be much higher than the sensitivity of the one or more pairs of small FOV receiving coils (sub coils 6-2 and 6-3 in this case) arranged in the phase encoding direction (z direction in this case). That is, the diameters of the sub coils 3-1 and 4-1 are increased to ensure that the sensitivity of the large FOV receiving coil (sub coils 3-1 and 4-1 in this case) is set to be nearly equal to or less than the sensitivity of the small FOV receiving coils (sub coils 6-2 and 6-3 in this case). In this case, the sensitivity to the inside of the subject is reduced. In order to prevent a reduction in the sensitivity to a subject (such as a human body) having an elliptical column shape, it is considered that the current loops of the large FOV sub coils 3-1 and 4-1 are provided along the surface of the subject and a plurality of appropriate small FOV surface sub coils is arranged in the direction (x direction in this case) of a longitudinal axis of a cross section (elliptical shape) to be imaged and in the direction (z direction in this case) of a short axis of the cross section to be imaged. The sensitivity profile of the large FOV sub coil in the direction of the short axis is more uniform than that of the large FOV sub coil in the direction of the longitudinal axis. In addition, the sensitivity of the large FOV sub coil in the direction of the short axis is higher than that of the large FOV sub coil in the direction of the longitudinal axis. When the direction of the short axis is selected as the phase encoding direction and high-speed imaging is performed, the G factor tends to be higher than the G factor obtained in the case where the direction of the longitudinal axis is selected as the phase encoding direction. When only the conventional large FOV receiving coil and the small FOV sub coil(s) are used, and when a sensitivity to a deep portion of the subject is maintained to be high, there is a cross section (a plane in which the large FOV coil is present) that cannot be imaged at high speed in an arbitrary direction. However, this problem has been solved by the arrangement of the sub coils provided by the present invention.

Comparative Example 2

Figure 21A:
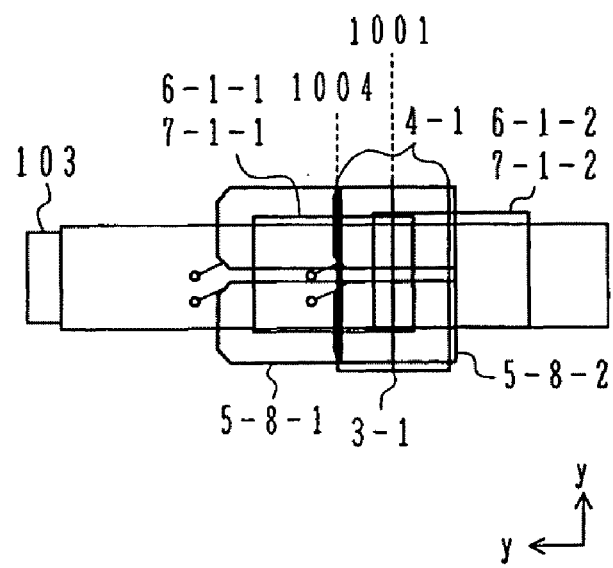
FIG. 21A is a diagram showing an example of a G factor in the case where a receiving coil according to comparative example 2 is used.
Figure 21B:
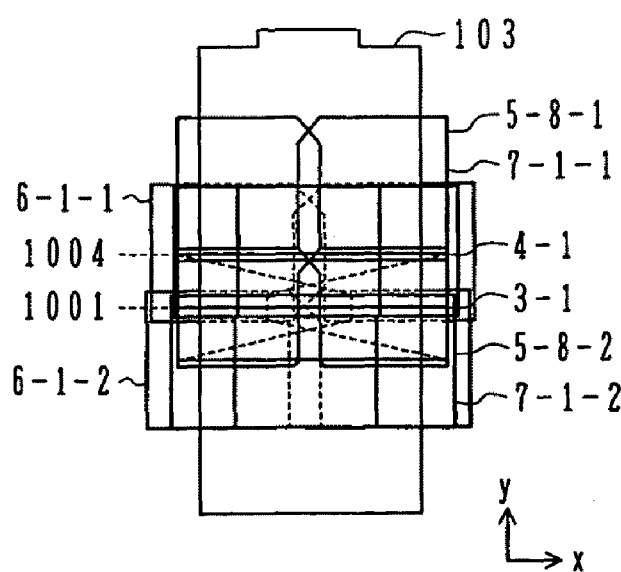
FIG. 21B is a diagram showing an example of a G factor in the case where the receiving coil according to comparative example 2 is used.
Figure 21C:
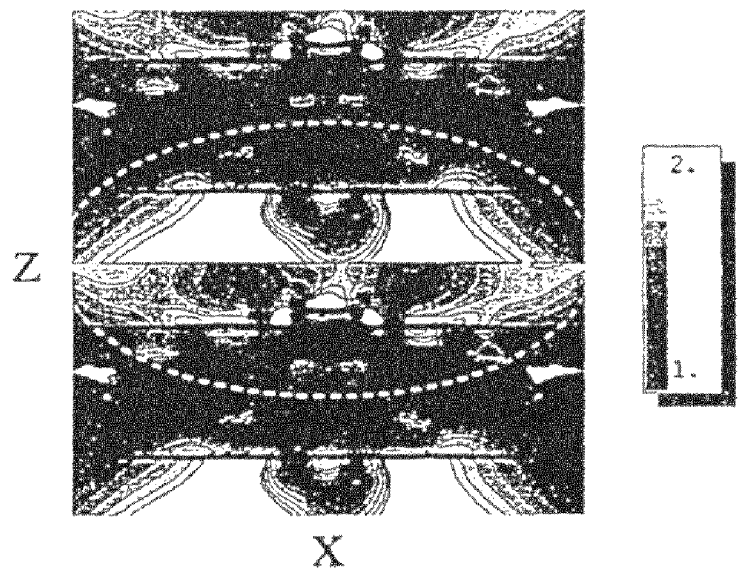
FIG. 21C is a diagram showing an example of the G factor in the case where the receiving coil according to comparative example 2 is used.
Figure 21D:
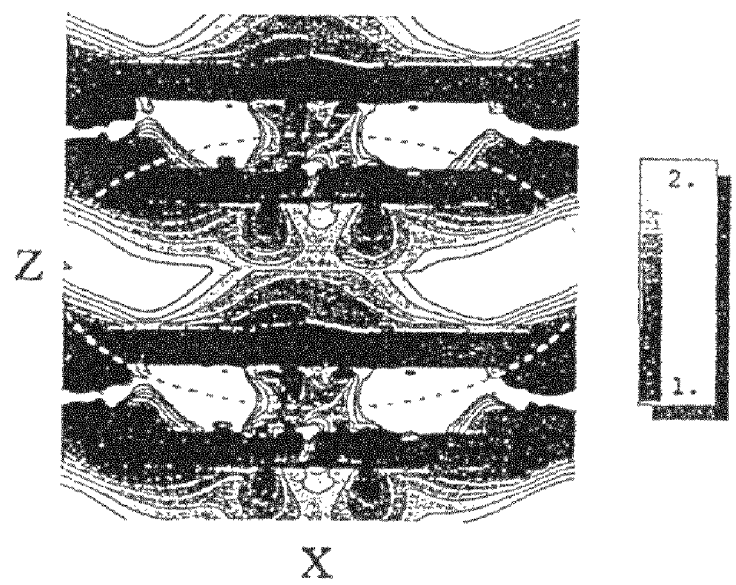
FIG. 21D is a diagram showing an example of the G factor in the case where the receiving coil according to comparative example 2 is used.

In comparative example 2, a receiving coil having the sub coil 5-1 arranged in a manner different from the arrangement used in the embodiment of the present invention is used, and the G factor is simulated. In comparative example 2, directions of lead wires (crossing each other) of the sub coil 5-1 are parallel to a plane including the body axis (parallel to the y direction) of the subject. FIGS. 21A and 21B are diagrams each showing an arrangement of sub coils. FIG. 21C shows the G factor in the case where the sub coils are arranged in the manner shown in FIG. 21A. FIG. 21D shows the G factor in the case where the sub coils are arranged in the manner shown in FIG. 21B. FIG. 21A shows the arrangement of the sub coils in the y-z plane when viewed from the x direction. FIG. 21B shows the arrangement of the sub coils in the x-y plane when viewed from the z direction. The sub coils 3-1 and 4-1 shown in FIGS. 21A and 21B are the same as the sub coils (denoted by the same reference numerals) of the receiving coil shown in FIGS. 3A to 3D. The sub coils 6-1-1 and 6-1-2 shown in FIGS. 21A and 21B are obtained by optimally transforming the conventional large FOV coil (saddle coil in this case) 6-1 and adequately overlap each other. The sub coils 7-1-1 and 7-1-2 shown in FIGS. 21A and 21B are obtained by optimally transforming the sub coil 7-1 exhibiting a sensitivity distribution in the RL direction and adequately overlap each other. The sub coils 6-1-1, 6-1-2, 7-1-1, and 7-1-2 shown in FIGS. 21A and 21B are the same as the sub coils (denoted by the same reference numerals) used in the embodiment of the present invention. Sub coils 5-8-1 and 5-8-2 are obtained by the manner in which the directions of the lead wires (crossing each other) of the sub coils 5-1-1 and 5-1-2 (having the respective cross points) described with reference to FIGS. 19A and 19B are changed from the state where the directions of the lead wires of the sub coils 5-1-1 and 5-1-2 cross a plane including the body axis (y axis in this case) of the subject to the state where the directions of the lead wires of the sub coils 5-1-1 and 5-1-2 are substantially parallel to the plane including the body axis (y axis in this case) of the subject. An electromagnetic coupling between the sub coils 5-8-1 and 5-8-2 is sufficiently reduced by adequately overlapping the sub coils 5-8-1 and 5-8-2. However, the two cross points 5-4 and 5-5 of the sub coil 5-1 shown in FIGS. 11A and 11B are not located in the cross section (1001) in which the sub coil 3-1 is present. Cross sections 1001 and 1004 shown in FIGS. 21A and 21B are planes (z-x planes) in which the current loops of the sub coils 3-1 and 4-1 are present, respectively.

FIG. 21C shows simulation results of the G factor in the case where the AP direction (z direction in this case) is selected as the phase encoding direction in the cross section 1001. FIG. 21D shows simulation results of the G factor in the case where the AP direction (z direction in this case) is selected as the phase encoding direction in the cross section 1004. FIGS. 21C and 21D two-dimensionally show each pixel value calculated by using the formula described in Non-Patent Document 2 based on a distribution of sensitivity of each sub coil. As apparent from the results shown in FIGS. 21C and 21D, when the sub coils are arranged to ensure that the directions of lead wires (crossing each other) of the sub coil 5-1 (having the two cross points) are substantially parallel to a plane including the body axis (y axis in this case) of the subject, the G factor is high.

While an arrangement of each sub coil is changed based on the arrangement of the sub coils shown in FIGS. 19A to 19F, the G factor is calculated for each arrangement. When the sub coils are arranged to ensure that the cross points 5-4 and 5-5 shown in FIGS. 11A and 11B are located in a plane that is located at substantially the same position as the plane 1001 in which the current loop of the large FOV sub coil 3-1 is present, the result indicating that the G factor is the lowest is obtained. In this case, it can be expected that an image having the highest S/N ratio is obtained.

INDUSTRIAL APPLICABILITY

According to the present invention, the receiving coil that is composed of the plurality of sub coils and exhibits an excellent G factor is provided. The combination of the sub coils of the receiving coil can be successively arranged in a direction perpendicular to the current loop of the first type of sub coil, e.g., in the direction of the body axis of the subject, without an increase in the number of channels. The whole-body receiving coil capable of being set in an excellent state can be configured. In addition, since the G factor is excellent, an image having a high S/N ratio can be obtained. Especially, in a method for reducing the time for imaging and using a distribution of sensitivity of sub coils to remove an aliasing artifact, an excellent image can be obtained even when any direction is selected as the phase encoding direction.

The invention claimed is:
1. A magnetic resonance imaging apparatus comprising:
   static magnetic field generation means for generating a static magnetic field in a vertical direction;
   imaging means for applying a high frequency magnetic field and a gradient magnetic field to a subject that is to be imaged and located in the static magnetic field; and
   receiving means for receiving a nuclear magnetic resonance signal generated by the subject to be imaged, the receiving means having a receiving coil composed of a plurality of types of sub coils;

wherein the receiving coil has a first sub coil and a second sub coil, the first sub coil forms a current loop around the subject to be imaged, the second sub coil is constituted by a pair of surface coils that face each other, are arranged between the subject to be imaged and the vicinities of the surface of the subject to be imaged, respectively have one cross point, and are conducted to each other or are substantially conducted to each other, and when a plane in which the current loop of the first sub coil is located is regarded as a standard plane, the second sub coil is arranged to ensure that the cross points of the surface coils are present in a plane located at substantially the same position as the standard plane.

2. The magnetic resonance imaging apparatus according to claim 1, wherein
the surface coils constituting the second sub coil are figure eight coils or transformed figure eight coils, and cross points of figure eights are located in a plane located at substantially the same as standard plane.

3. The magnetic resonance imaging apparatus according to claim 1, wherein
the standard plane is parallel to the direction of the static magnetic field.

4. The magnetic resonance imaging apparatus according to claim 1, wherein
the pair of surface coils are located substantially symmetrically with respect to a plane perpendicular to the direction of the static magnetic field.

5. The magnetic resonance imaging apparatus according to claim 1, wherein
the receiving coil has a third sub coil forming two current loops in a plurality of planes, the two current loops being connected with each other to ensure that currents flow in the two current loops and in directions opposite to each other, the plurality of planes sandwiching the standard plane and being parallel to the standard plane.

6. The magnetic resonance imaging apparatus according to claim 1, wherein
the receiving coil having a third sub coil forming two current loops in two planes that sandwich the standard plane, is parallel to the standard plane and symmetrical to the standard plane, and is apart by distances nearly equal to each other from the standard plane, the two current loops being connected with each other to ensure that currents flow in the two current loops and in directions opposite to each other.

7. The magnetic resonance imaging apparatus according to claim 1, wherein
the receiving coil has at least one fourth sub coil that forms two current loops around and near the surface of the subject crossing the standard plane.

8. The magnetic resonance imaging apparatus according to claim 7, wherein
at least one pair of the fourth sub coils is located substantially symmetrically with respect to the standard plane.

9. The magnetic resonance imaging apparatus according to claim 1, wherein
the receiving coil has at least one fifth sub coil that forms three current loops around and near the surface of the subject crossing the standard plane.

10. The magnetic resonance imaging apparatus according to claim 9, wherein
at least one pair of the fifth sub coils is located substantially symmetrically with respect to the standard plane.

11. The magnetic resonance imaging apparatus according to claim 1, wherein
the receiving coil has at least one fourth sub coil and at least one fifth sub coil, the at least one fourth sub coil forming two current loops around the surface of the subject crossing the standard plane, the at least one fifth sub coil forming three current loops around the surface of the subject crossing the standard plane, and
a cross point of the two current loops of the fourth sub coil is located at substantially the center of two cross points present between the current loops of the at least one fifth sub coil.

12. The magnetic resonance imaging apparatus according to claim 1, wherein
a plurality of the receiving coils is arranged side by side in a direction in which the plurality of sub coils is arranged in a direction in which the plurality of sub coils crosses the standard plane.

13. The magnetic resonance imaging apparatus according to claim 12, comprising:
movement means for moving the subject in one direction perpendicular to the direction of the static magnetic field, wherein
the plurality of types of sub coils is arranged in a direction in which the movement means moves.

14. The magnetic resonance imaging apparatus according to claim 12, wherein
among the plurality of types of sub coils, at least one type of the sub coils located around and near the surface of the subject is arranged to ensure that the sub coils adjacent to each other partially overlap each other in the direction in which the sub coils are arranged.

15. The magnetic resonance imaging apparatus according to claim 7, wherein
when the side close to the subject to be imaged is regarded as an inner side and the side distant from the subject to be imaged is regarded as an outer side, at least one of the fourth and fifth sub coils is located on the inner side with respect to the first to third sub coils.

16. The magnetic resonance imaging apparatus according to claim 15, comprising:
a base that has flexibility, holds the least one of the fourth and fifth sub coils and is openable and closable at a region at which a coil conductor is not present.

17. The magnetic resonance imaging apparatus according to claim 12, comprising:
switching means for sequentially switching between the plurality of sub coils.

18. The magnetic resonance imaging apparatus according to claim 17, comprising:
movement means for moving the subject in one direction perpendicular to the direction of the static magnetic field, wherein
the switching means is synchronized with a movement of the movement means to switch between the plurality of sub coils.

19. A receiving coil for receiving a nuclear magnetic resonance signal, comprising:
a first sub coil that forms a current loop in a first plane; and
a second sub coil that is arranged symmetrically with respect to a second plane crossing the first plane and constituted by a pair of surface coils respectively having one cross point, wherein
the second sub coil is arranged to ensure that the cross points are located in a plane including the first plane.

* * * * *